United States Patent
Uchida et al.

(10) Patent No.: US 6,275,750 B1
(45) Date of Patent: Aug. 14, 2001

(54) APPARATUS FOR SETTING HEATING CONDITION IN HEATING FURNACE AND THERMAL ANALYZER FOR OBJECT TO BE HEATED IN HEATING FURNACE

(75) Inventors: Hiroki Uchida; Seiki Sakuyama, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/116,472

(22) Filed: Jul. 16, 1998

(30) Foreign Application Priority Data

| Jul. 18, 1997 | (JP) | ................................................ 9-194177 |
| Nov. 14, 1997 | (JP) | ................................................ 9-313681 |
| Apr. 28, 1998 | (JP) | ................................................ 10-119423 |

(51) Int. Cl.[7] ............................ G05D 23/30; G01N 25/30
(52) U.S. Cl. ......................... 700/300; 700/121; 700/299; 374/11; 374/14
(58) Field of Search ............................ 700/300, 98, 121, 700/299; 236/44, 44 R, 44 A, 44 B, 44 C, 44 E; 177/212; 374/10, 11, 14, 45

(56) References Cited

U.S. PATENT DOCUMENTS

| 4,731,017 | * | 3/1988 | Echigo et al. ........................ 432/175 |
| 4,927,068 | * | 5/1990 | Naka et al. ........................... 228/103 |
| 4,982,347 | * | 1/1991 | Rackerby et al. .................... 700/299 |
| 5,151,871 | * | 9/1992 | Matsumura et al. ................. 700/300 |
| 5,228,114 | * | 7/1993 | Suzuki ................................. 392/416 |
| 5,417,771 | * | 5/1995 | Arita et al. ........................... 148/23 |
| 5,439,291 | * | 8/1995 | Reading .................................. 374/11 |
| 5,493,078 | * | 2/1996 | Uchiike .................................. 177/212 |
| 5,588,746 | * | 12/1996 | Minobe et al. ....................... 374/10 |
| 5,669,554 | * | 9/1997 | Nakamura et al. ................. 236/44 C |
| 5,770,835 | * | 6/1998 | Sakuyama et al. ................. 219/388 |
| 5,788,373 | * | 8/1998 | Huetter et al. ........................ 374/10 |
| 5,826,983 | * | 10/1998 | Nakamura et al. .................... 374/14 |
| 5,838,543 | * | 11/1998 | Nakamura et al. .................. 361/704 |
| 5,950,709 | * | 9/1999 | Krueger et al. ..................... 165/11.1 |
| 6,146,012 | * | 11/2000 | Nakamura et al. ..................... 374/10 |

FOREIGN PATENT DOCUMENTS

| 41 26 597 | 2/1993 | (DE) . |
| 3-6890 | 1/1991 | (JP) . |
| 4-7675 | 1/1992 | (JP) . |
| 4-288967 | 10/1992 | (JP) . |
| 6-77639 | 3/1994 | (JP) . |

OTHER PUBLICATIONS

Youg–yao Yang et al.: "Dynamic Model Based Optimization Control for Reheating Furnaces," vol. 10, No. 1, pp. 11–20, Computers in Industry, Mar. 1, 1988.

N. Yoshitani et al.: "Optimal Slab Heating Control for Reheating Furnaces," pp. 3031–3035, 1991 American Control Conference, Jun. 1991.

* cited by examiner

*Primary Examiner*—William Grant
*Assistant Examiner*—Paul Rodriguez
(74) *Attorney, Agent, or Firm*—Armstrong, Westerman, Hattori, McLeland & Naughton, LLP

(57) ABSTRACT

The present invention relates to a method and apparatus for setting heating conditions in a heating furnace wherein a temperature distribution of an object to be heated is measured required minimum times and thermal analysis for the object is performed, thereby optimally heating the object. When the object to be heated is heated by means of a plurality of heating sources in the heating furnace, heating conditions are set to the heating sources respectively, the object is heated, a temperature of the heated object is then detected at a plurality of detection points, a relationship between a variation in the heating conditions in one of the heating sources and a variation in a detected temperature at each of the detection points of the heated object is computed for each heating source, heating conditions in the heating source for causing the detection point of the heated object to have a target temperature are calculated based on the computed relationship, and the heating sources are controlled on the calculated heating conditions.

9 Claims, 13 Drawing Sheets

APPARATUS FOR SETTING HEATING CONDITION IN HEATING FURNACE AND THERMAL ANALYZER FOR OBJECT TO BE HEATED IN HEATING FURNACE

CROSS-REFERENCES TO RELATED APPLICATIONS

This application is related to Japanese applications Nos. HEI 9(1997)-194177, filed on Jul. 18, 1997, HEI 9(1997)-313681, filed on Nov. 14, 1997, and HEI 10(1998)-119423, filed on Apr. 28, 1998, whose priorities are claimed under 35 USC § 119, the disclosures of which are incorporated by reference in their entirety.

BACKGROUND OF THE INVENTION

1. Field of the Invention

The present invention relates to an apparatus for setting heating conditions in a heating furnace and a thermal analyzer for an object to be heated in the heating furnace. More particularly, the present invention relates to an apparatus for setting heating conditions which is to be suitably used for control of a reflow furnace for heating a printed-wiring board to perform soldering, for example, which is to be suitably used when heating the printed-wiring board in the reflow furnace, and a thermal analyzer for the printed-wiring board which is suitably used when setting the heating conditions.

2. Description of the Related Art

A printed-wiring board having electronic components mounted thereon (which is also referred to as a circuit substrate, a printed board, a printed substrate or the like) is usually manufactured by a process of printing a creamy soldering material (soldering paste) onto the printed-wiring board, mounting the electronic components thereon, and putting them into a reflow furnace (which is also referred to as a reflow soldering apparatus or a reflow apparatus) to perform reflow soldering.

In this process, the printed-wiring board is put on a conveyer provided in a tunnel-shaped furnace and is carried. At the carrying step, the printed-wiring board is heated by a heating source provided in the furnace, the soldering paste is melted with an increase in a temperature of the printed-wiring board, is then carried to the outside of the furnace and exposed to room temperature for cooling. Consequently, the solder is solidified. Thus, soldering is completed.

In the reflow soldering process, the printed-wiring board is heated to a temperature of 200° C. or more at which the solder is melted. In that case, heating control is performed in such a manner that a temperature profile becomes a curve shown in a graph of FIG. 5. In order to lessen thermal damages caused by rapid heating, a temperature is not simply raised but preheating is performed. Then, uniform heating is performed to hold the temperature of the printed-wiring board constant. Thereafter, heating is performed to a temperature of 200° C. or more at which the solder is melted. Thus, heating control is performed in three stages.

However, a plurality of components having various heat capacities are generally mounted on the printed-wiring board so that the temperature is varied on the printed-wiring board. Therefore, it is very hard to set heating conditions that the printed-wiring board is heated enough to melt the solder and that temperatures of small components are not raised too much. For this reason, a plurality of heating sources having different properties are provided in the reflow furnace to vary the influence of the heating source depending on a position of the printed-wiring board. More specifically, a plurality of near-infrared radiation heaters and a plurality of far-infrared radiation heaters or a plurality of hot air fan heaters whose temperatures are kept different are provided above and below the conveyer so that a heating zone is divided into plural portions. Heating conditions of the heating source in each heating zone are properly set respectively to heat the printed-wiring board in such a manner that a temperature difference of the printed-wiring board is reduced as much as possible and a temperature distribution of the printed-wiring board is uniform.

For this reason, conventionally, a temperature sensor such as a thermoelectric couple has been attached to the printed-wiring board to measure a rise in the temperature of the printed-wiring board, and temperature setting has been changed repeatedly until a target temperature profile is obtained.

However, a work for changing the temperature setting is performed by a worker's perception or guess. Therefore, there is no assurance that optimum heating conditions can be set. Furthermore, the heating conditions are repeatedly set and the temperature of the printed-wiring board is repeatedly measured to find the optimum conditions. Consequently, plenty of time is required to set the optimum heating conditions, and the worker's skill and experience are necessary.

In a case where the heating conditions in the reflow furnace are not suitable, for example, the printed-wiring board is heated too much, a thermal stress is easily applied to small chip components having small thermal capacities and the printed-wiring board. Conversely, in a case where the heating is insufficient, solder joint portions of large components having great thermal capacities are unmelted.

For a printed-wiring board to be newly manufactured, therefore, it is necessary to find optimum heating operation conditions for the reflow furnace in which a thermal stress applied to the components and the printed-wiring board is lessened as much as possible and solder joint portions can fully be heated. For each solder joint portion on the printed-wiring board, a temperature profile should be examined in detail.

This examination is performed by repeatedly, several times, acquiring the temperature profile of the printed-wiring board (by measuring the same temperature profile by means of a thermoelectric couple) and resetting heating conditions such as a heater temperature and the like. For this reason, a lot of man-day is required to fix the thermoelectric couple and to measure the temperature profile plural times. Furthermore, every time the heating conditions are changed, plenty of time is taken to stabilize the heater temperature, that is, considerable man-day and time are required. In addition, the worker's experience and accumulation of know-how are important in order to predict the optimum heating conditions based on a result of the measurement of the temperature profile.

Therefore, the following has been investigated. Thermal analysis is performed by using a computer to quantitatively grasp a heating state in the reflow furnace in order to enhance reliability of the printed-wiring board. Moreover, the temperature profile of a heated object in the reflow furnace is predicted and utilized for setting the optimum operation conditions in the reflow furnace.

FIG. 10 is a flowchart showing a processing of performing thermal analysis for the printed-wiring board in the reflow furnace using the prior art.

At Steps 501 to 507, an analytic model of the printed-wiring board is first generated in order to perform the thermal analysis for the printed-wiring board. On the printed-wiring board are mounted electronic components having several hundred or more junction terminals such as lead frames having fine and complicated shapes which are referred to as a QFP (Quad Flat Package), a SOP (Small Outline Package), a BGA (Ball Grid Array) and the like.

At the Step 501, a method for simplifying such an analytic model of the electronic component is examined in order to shorten a computation time or to reduce man-day for creating the analytic model. It is necessary to simplify the analytic model without reducing computation precision. To perform the simplification, technical knowledge and experience are required.

Next, the analytic model of the component is created at Step 502 based on a result of the examination of the simplifying method (the Step 501) At Step 503, a physical property value is defined for the created analytic model of the component.

In general, a plurality of electronic components are mounted on the printed-wiring board. Therefore, a work for simplifying the analytic model of the component (the Step 501) and a shape forming work (the Step 502) are performed for each component (Step 504).

At the end of the work for creating the analytic model, the shape of the printed-wiring board for mounting the electronic components thereon is formed, a physical property is defined (Steps 505 and 506), and a final analytic model of the printed-wiring board is created.

In a case where the printed-wiring board has a large size and a number of electronic components are mounted on the printed-wiring board, the work for creating the analytic models of the electronic components requires a lot of man-day. In a case where analysis is utilized for designing the printed-wiring board, a work which requires such enormous man-day should be repeated every time a layout of the components is changed. In a case where analysis is performed to set the operation conditions for the reflow furnace on a manufacturing site or the like, a plurality of shape models of the printed-wiring board should be created and analyzed in a time which is as short as possible.

At the Step 507, a computation grid is created on the analytic model manually or automatically. More specifically, the analytic model is divided into grids in proper positions.

As described above, a reflow furnace using an infrared heater has frequently been utilized for the soldering of the electronic components onto the printed-wiring board because the reflow furnace has excellent productivity. A plurality of infrared heaters having temperatures variously set are arranged on upper and lower faces of the reflow furnace. The printed-wiring board is carried for heating by means of a conveyer at a constant speed between the infrared heaters.

Accordingly, it is necessary to accurately calculate a radiation heat quantity received by the printed-wiring board from the infrared heater at Step 508 in order to perform the thermal analysis for the printed-wiring board in the reflow furnace. The Step 508 will be described below.

A net radiation heat quantity received by the printed-wiring board is calculated based on a balance of the radiation heat quantity received by the printed-wiring board and a radiation heat quantity. The heat quantity received by the printed-wiring board is obtained from a product of a radiation heat quantity of each heater which is calculated based on a surface temperature of each heater arranged in the furnace and an emissivity of a surface of the heater and a ratio (Radiation shape factor) in which the radiation heat quantity reaches the printed-wiring board from the heater.

Examples of the heat quantity received by the printed-wiring board include a radiation from an internal wall of the furnace to the printed-wiring board, a radiation which is reflected on a peripheral wall and reaches the printed-wiring board from the heater, and the like. These heat quantities are also calculated. The net radiation heat quantity received by the printed-wiring board is a difference between the radiation heat quantity received by the printed-wiring board and a radiation heat quantity emitted from the printed-wiring board toward the outside.

The printed-wiring board receives a heat quantity by convection heat transfer in an atmosphere in the furnace and is thus heated. Therefore, the heat quantity is also calculated at Step 509. The sum of these heat quantities is set as a boundary condition to an analytic model of the printed-wiring board at Step 510.

Next, the printed-wiring board having the boundary condition set is analyzed at Step 511. This analysis is executed by a finite element method, a difference method and the like. As described above, the printed-wiring board is carried by means of the conveyer in the heating furnace, and a relative position relationship between each heater and the printed-wiring board is changed with time. For this reason, the radiation heat quantity received by the printed-wiring board, that is, the radiation boundary condition is not constant but is changed with time. Therefore, it is necessary to recalculate the radiation boundary condition every certain time. Also in a heating state obtained by the convection, an atmospheric temperature and a convection heat transfer coefficient are varied depending on a position in the furnace. Therefore, it is also necessary to recalculate the convection boundary condition every certain time. For this reason, it is decided whether or not the analysis has been performed up to an outlet of the furnace at Step 512. If the outlet of the furnace is not reached, the Steps 508 to 511 are repeated.

With conventional thermal analysis software, such a boundary condition which is changed with time has been neither calculated nor automatically set to a thermal analysis object. Therefore, it has been necessary to manually perform all these works.

Thus, the analysis is completed. Analysis precision is sometimes low depending on the method for simplifying the analytic model of a component at the Step 501. In some cases, therefore, it is necessary to reconsider the simplifying method at Step 514 and to perform the analysis from the beginning again.

Conventionally, the analytic model of the printed-wiring board created by using much man-day has been set by repetitive calculation of the radiation boundary condition and the convection boundary condition in each position in the furnace as described above, thereby performing thermal analysis while the printed-wiring board enters the reflow furnace and gets out thereof.

Thus, the conventional thermal analyzing technique has the following problems. Therefore, the thermal analysis for the printed-wiring board in the reflow furnace could not easily be performed.

① The thermal analysis object (printed-wiring board) is carried by means of the conveyer in the heating furnace, and radiation and convection boundary conditions are changed with time. Therefore, it is necessary to calculate and set the radiation boundary condition and the convection boundary condition for the thermal analysis object every constant time.

② Much complicated man-day is required to form the shape of the analytic model of the printed-wiring board. In addition, technical knowledge and experience are required to simplify the analytic model of the electronic component mounted on the printed-wiring board.

In order to solve these respects, accordingly, it is important to develop the method for simplifying the analytic model having high analysis precision which can be applied to non-steady heat conduction analysis (for example, thermal analysis for the printed-wiring board moving in the reflow furnace) for a long time.

FIG. 17 shows a state of an actual printed-wiring board seen from a side. Various components are mounted on a substrate 601. The reference numeral 602 denotes a SOP (Small Outline Package), the reference numeral 603 denotes a QFP (Quad Flat Package), and the reference numeral 604 denotes a PGA (Pin Grid Array). Each component is connected electrically and mechanically to the substrate 601 through a lead 605 and a pin 606 of a connecting terminal.

In a case where the heat conduction analysis is performed for the printed-wiring board by using the difference method or the like, it is necessary to perform a work for modeling (simplifying) the shape of the printed-wiring board to create a computation grid on the shape. An analytic model having a computation grid created as shown in FIG. 18 is generally taken as the printed-wiring board having the shape shown in FIG. 17. FIG. 18 shows a state of the printed-wiring board seen from a side as in FIG. 17. For explanation, the computation grid is shown in two dimensions. The actual printed-wiring board has a three-dimensional shape. Correspondingly, the computation grid is also created in three-dimensions.

A computation time necessary for the heat conduction analysis or the like is proportional to the number of computation elements, and is inversely proportional to a square of a space between the computation grids. For this reason, in a case where the computation grid is created as shown in FIG. 18, the number of three-dimensional computation elements is enormous. In addition, since the computation grid is created according to a fine lead section and components having various heights, the space between the computation grids becomes small. Therefore, the computation time is increased enormously in FIG. 18.

In order to shorten the computation time, it is necessary to increase the computation element. In a case where a printed-wiring board having a complicated shape is analyzed by using the difference method, the number of the computation elements is large as shown in FIG. 18 and a dimension of the computation element is reduced. Therefore, the computation could not conventionally be performed in a short time.

In order to solve such a problem of the computation time, conventionally, the printed-wiring board has generally been treated as a two-dimensional analytic model to shorten the computation time. In this case, however, electronic components mounted on the substrate are simply modeled. Therefore, heat transfer between the substrate and the electronic component cannot accurately be considered for the analysis so that errors are increased around the components.

SUMMARY OF THE INVENTION

The present invention has been made in consideration of such circumstances, and provides an apparatus for setting heating conditions in a heating furnace which can measure a temperature distribution of an object to be heated required minimum times or can perform thermal analysis for the object without repeatedly setting the heating conditions many times by a worker's perception or guess, thereby optimally heating the object.

Furthermore, the present invention provides a thermal analyzer capable of easily performing thermal analysis for a heated object in a heating furnace without requiring much man-day and specially technical knowledge for the thermal analysis and of obtaining almost the same temperature distribution result as in a case where the object is actually put in the heating furnace.

In addition, the present invention provides a thermal analytic model of a printed-wiring board which can considerably reduce the number of computation elements and can perform thermal analysis in a shorter time than in a case where a conventional analytic model is used.

The present invention provides a method for setting heating conditions in a heating furnace, comprising the steps of setting heating conditions to a plurality of heating sources respectively when heating an object to be heated by means of the heating sources in the heating furnace, heating the object, detecting a temperature of the heated object at a plurality of detection points, computing, for each heating source, a relationship between a variation in the heating conditions in one of the heating sources and a variation in a detected temperature at each of the detection points of the object, calculating heating conditions in the heating source for causing the detection point of the object to have a target temperature based on the computed relationship, and controlling the heating sources on the calculated heating conditions.

According to the present invention, the relationship between the variation in the heating conditions of one of the heating sources and the variation in the detected temperature at each detection point of the heated object is obtained for each heating source. Next, the heating conditions of the heating source for causing each detection point of the heated object to have the target temperature are calculated based on the obtained relationship.

Thus, the relationship between the variation in the heating conditions of the heating source and the variation in the temperature at the detection point of the heated object is first grasped. Therefore, the heating conditions of the heating source for causing each detection point of the heated object to have the target temperature can unconditionally be set.

Accordingly, if the present invention is applied to the reflow furnace, for example, it is possible to obtain optimum heating conditions for minimizing a temperature difference of the printed-wiring board in such a manner that thermal damages on small electronic components mounted on the printed-wiring board are minimized and solderability onto large electronic components is not deteriorated. Consequently, workers other than the skilled in the art can set the optimum heating conditions in a required minimum time and working in the reflow furnace having a plurality of heating sources without repeatedly setting the heating conditions limitlessly by the workers' perception or guess.

DESCRIPTION OF THE PREFERRED EMBODIMENTS

Figure 1:
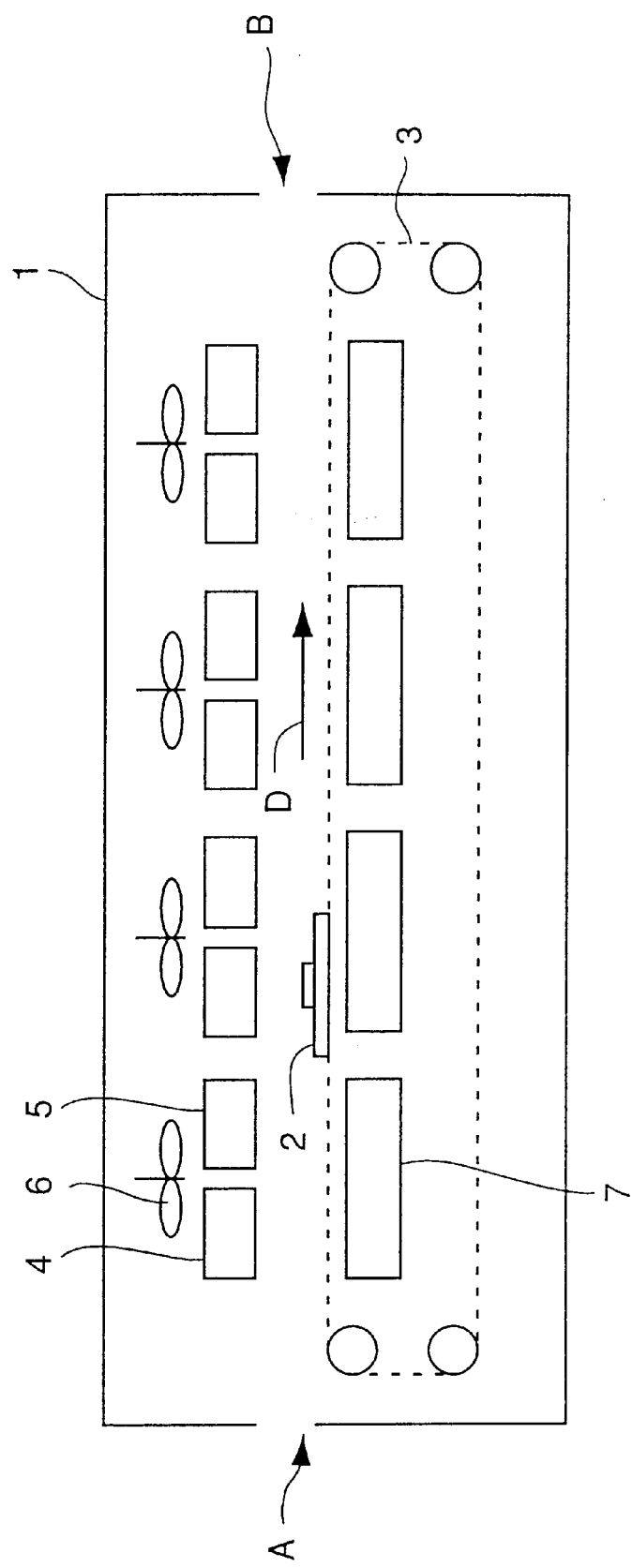
FIG. 1 is a view illustrating a structure of a reflow furnace.

While form of a heating furnace to which a method for setting heating conditions according to the present invention can be applied is not particularly restricted, it can mainly be applied to an electric heating furnace using electric heating more suitably than a combustion heating furnace using petroleum, gas, coal and the like.

In consideration of a heating method of the heating source, examples of the electric heating furnace include various heating furnaces using a method such as resistance heating, arc plasma heating, induction heating, electromagnetic wave heating, infrared heating, beam heating or the like. The electric heating furnace which can be applied more suitably to the method for setting heating conditions according to the present invention is an electric heating furnace using two or more various electric heating sources of a hot air blasting type such as a hot air fan heater and a heat radiation type such as an infrared heater. For example, the method according to the present invention can be applied most suitably to an electric heating furnace such as a reflow furnace which carries, by means of a conveyer, a printed-wiring board having electronic components mounted thereon and heats the printed-wiring board by the hot air fan heater or the infrared heater to perform reflow soldering.

In the present invention, a solid is intended for an object to be heated. Any heating object which requires temperature control can be used. For example, if the present invention is applied to the reflow furnace, the printed-wiring board having electronic components mounted thereon can be taken as the object.

While two or more heating sources capable of heating the object can be used as the heating sources, various heaters such as a near-infrared radiation heater, a far-infrared radiation heater, a hot air fan heater and the like can be applied.

It is necessary to detect a temperature of the heated object at a plurality of detection points. It is preferable that the number of the detection points should be coincident with that of the heating sources to solve plural simultaneous equations. The temperature of the object may be detected at the detection point by attaching a temperature sensor such as a thermoelectric couple to the object or by performing thermal analysis based on computation. In a case where the computation is to be performed, a thermal analyzing method described in Japanese Laid-Open Patent Publication No. Hei 8-152377 filed on Jun. 13, 1996 by the present applicant can be applied, for example.

A microcomputer comprising a CPU, a ROM, a RAM and an I/O port can be applied to computation of a relationship between a variation in heating conditions and a variation in a detected temperature of the object, calculation of the heating conditions, and control of the heating sources.

Furthermore, the present invention provides an apparatus for setting heating conditions in a heating furnace, comprising setting means for setting heating conditions to a plurality of heating sources respectively when heating an object to be heated by means of the heating sources in the heating furnace, detecting means for detecting a temperature of the heated object at a plurality of detection points, computing means for computing, for each heating source, a relationship between a variation in the heating conditions in one of the heating sources and a variation in a detected temperature at each of the detection points of the object, calculating means for calculating heating conditions in the heating source for causing the detection point of the object to have a target temperature based on the computed relationship, and control means for controlling the heating sources on the calculated heating conditions.

In addition, the present invention provides a computer readable recording medium which records a program for causing a computer to execute a procedure to control the apparatus for setting heating conditions in the heating furnace.

The present invention further provides a thermal analyzer for an object to be heated in a heating furnace, comprising object data input means for inputting a shape and a physical property value of the object moving in the heating furnace at a predetermined speed, computation grid generating means for dividing the object in a grid shape to generate a computation grid and for defining a physical property value for each computation element divided by the computation grid, heating condition input means for inputting heating conditions in the heating furnace, setting means for setting, on the input heating conditions, a radiation boundary condition and a convection boundary condition of the object which are changed with a passage of time, calculating means for calculating a temperature distribution for each computation element every movement of the object within a predetermined range based on the radiation boundary condition and the convection boundary condition which are set by the setting means and heat conduction in the object for each computation element generated by the computation grid generating means, and output means for outputting the temperature distribution calculated by the calculating means.

In the present invention, the object is moved in the heating furnace at a predetermined speed. As an example, the printed-wiring board having electronic components mounted thereon which is carried in the reflow furnace at a constant speed can be taken.

Any of two-dimensional and three-dimensional shapes of the object can be input. An actual dimension of the object may be input, or objects having various dimensions may previously be stored and an object having a desired dimension may be selected for input, for example.

Physical property values include data such as specific heat, density, thermal conductivity, infrared absorptance and the like. The physical property values of various materials may previously be stored, and the material of the object may be specified to input the physical property value of the object.

Accordingly, the object data input means may be formed by a combination of a component shape data memory for previously storing a shape of the printed-wiring board or shapes of the electronic components mounted on the printed-wiring board and a pointing device for calling and specifying a desired shape from the component shape data memory, for example.

The physical property value memory which previously stores physical property values of the printed-wiring board and the electronic components may further be provided. In that case, when the shapes of the printed-wiring board and the electronic components are specified, it is desirable that corresponding physical property values can be called from the physical property value memory and be automatically related to the printed-wiring board and the electronic components, respectively.

The heating conditions in the heating furnace include an internal structure of the heating furnace, a size of each heater, an arrangement position, a set temperature, a position of a blow-off port of each blower, a set temperature of the blower, a moving speed of the object, for example, a carrying speed of a conveyer belt if the object is carried by means of the conveyer belt, and the like. A keyboard can be used as heating condition input means for inputting the heating conditions in the heating furnace.

The setting means can be formed by a processor for setting radiation boundary conditions based on furnace radiation characteristic data which have previously been stored, and a processor for setting convection boundary conditions based on furnace convection characteristic data which have previously been stored.

A microcomputer comprising a CPU, a ROM, a RAM and an I/O port can be applied to the computation grid generating means, the setting means and the calculating means.

Various display devices such as a CRT display device, a plasma display device and the like and various printers such as a heat transfer printer, a laser printer and the like can be used as the output means.

The present invention further provides a computer readable recording medium which records a program for causing a computer to execute a procedure to control a thermal analyzer for the object in the heating furnace.

According to the present invention, the shape of the object and the physical property value thereof are input and the heating conditions in the heating furnace are input. Consequently, a temperature distribution for each computation element is calculated and output for each movement of the object within a predetermined range based on the radiation boundary conditions and the convection boundary conditions for the object which are automatically changed with a passage of time and heat conduction in the object.

Consequently, a user can easily perform the thermal analysis for the object such as the printed-wiring board in the heating furnace by using the thermal analyzer for the object in the heating furnace according to the present invention, for example.

In the thermal analyzer for an object to be heated in a heating furnace, desirably, the object data input means includes shape and physical property value input means for inputting a shape of a printed-wiring board and a physical property value thereof, a shape of a component mounted on the printed-wiring board and a physical property value thereof, a shape of a gap space between the component and the printed-wiring board, and a shape of a terminal space having a terminal for connecting the component and the printed-wiring board and a physical property value of the terminal, and the computation grid generating means further includes component and gap space model setting means for setting a model in which the component and gap space input from the shape and physical property value input means is regarded as a rectangular prism having a thickness that is almost equal to a thickness of the printed-wiring board, terminal model setting means for setting a model in which the input terminal space is regarded as a rectangular prism having a thickness corresponding to a size of the terminal, and correcting means for correcting physical property values for the rectangular prism models of the component, the gap space and the terminal space which are thus obtained.

With this structure, the component and gap space is regarded as the rectangular prism having the thickness which is almost equal to the thickness of the substrate, and the terminal space is regarded as the rectangular prism having the thickness corresponding to the size of the terminal. For the rectangular prism models thus obtained, the physical property values are corrected respectively. Thus, actual physical property values are applied to the rectangular prism models, respectively. Consequently, the number of the computation elements can considerably be reduced so that analysis computation can be performed in a shorter time than in the prior art. In addition, the analysis can accurately be performed without errors caused by modeling.

The present invention further provides a controller for a reflow furnace comprising a thermal analyzer which performs thermal analysis for a printed-wiring board moving in the reflow furnace, and a heating condition setting apparatus for setting heating conditions in the reflow furnace based on a result of the thermal analysis obtained by the thermal analyzer, the thermal analyzer including shape and physical property value input means for inputting a shape of a printed-wiring board to be heated in the reflow furnace and a physical property value thereof, a shape of a component mounted on the printed-wiring board and a physical property value thereof, a shape of a gap space between the component and the printed-wiring board, and a shape of a terminal space having a terminal for connecting the component and the printed-wiring board and a physical property value of the terminal, component and gap space model setting means for setting a model in which the input component and gap space is regarded as a rectangular prism having a thickness that is almost equal to a thickness of the printed-wiring board, terminal model setting means for setting a model in which the input terminal space is regarded as a rectangular prism having a thickness corresponding to a size of the terminal, correcting means for correcting physical property values for the rectangular prism models of the component, the gap space and the terminal space which are thus obtained, computation grid generating means for dividing the rectangular prism model in a grid shape to generate a computation grid and for defining a physical property value for each computation element divided by the computation grid, heating condition input means for inputting heating conditions in the heating furnace, setting means for setting, on the input heating conditions, a radiation boundary condition and a convection boundary condition of the object which are changed with a passage of time, calculating means for calculating a temperature distribution for each computation element every movement of the object within a predetermined range based on the radiation boundary condition and the convection boundary condition which are set by the setting means and heat conduction in the object for each computation element generated by the computation grid generating means, and output means for outputting the temperature distribution calculated by the calculating means, and the heating condition setting apparatus including heating condition setting means for setting heating conditions to a plurality of heating sources respectively when heating the object by means of the heating sources in the heating furnace, temperature detecting means for receiving, from the thermal analyzer, a temperature distribution for each computation element of the heated rectangular prism model, computing means for computing, for each heating source, a relationship between a variation in the heating conditions in one of the heating sources and a variation in a temperature of each computation element of the rectangular prism model, heating condition calculating means for calculating heating conditions in the heating source for causing the computation element of the rectangular prism model to have a target temperature based on the computed relationship, and control means for controlling the heating sources on the calculated heating conditions.

Furthermore, the present invention provides a computer readable recording medium which records a program for causing a computer to execute a procedure to control the controller in the reflow furnace.

The present invention will be described in detail based on preferred embodiments with reference to the drawings. The present invention is not restricted to the following detailed description.

For description, a reflow furnace will be taken as an example of a heating furnace which applies the present invention.

First Embodiment

As a first embodiment, an apparatus for setting heating conditions in a reflow furnace and a processing to be performed by the apparatus will be described below.

FIG. 1 is a view illustrating a structure of the reflow furnace.

In FIG. 1, the reference numeral 1 denotes a tunnel-shaped furnace casing, the reference numeral 2 denotes a printed-wiring board to be heated (hereinafter referred to as a substrate), the reference numeral 3 denotes a conveyer for carrying the printed-wiring board 2, the reference numeral 4 denotes a heating source 1 provided above the conveyer 3, the reference numeral 5 denotes a heating source 2 provided above the conveyer 3, the reference numeral 6 denotes a heating source 3 provided above the conveyer 3, and the reference numeral 7 denotes a heating source 4 provided below the conveyer 3. In the present embodiment, a far-infrared radiation heater is used for the heating sources 1 and 4, a near-infrared radiation heater is used for the heating source 2, and a hot air fan heater is used for the heating source 3.

An inside of the furnace is divided into four heating zones 1 to 4. The four heating sources 1 to 4 are provided in the heating zones, respectively.

Figure 2:
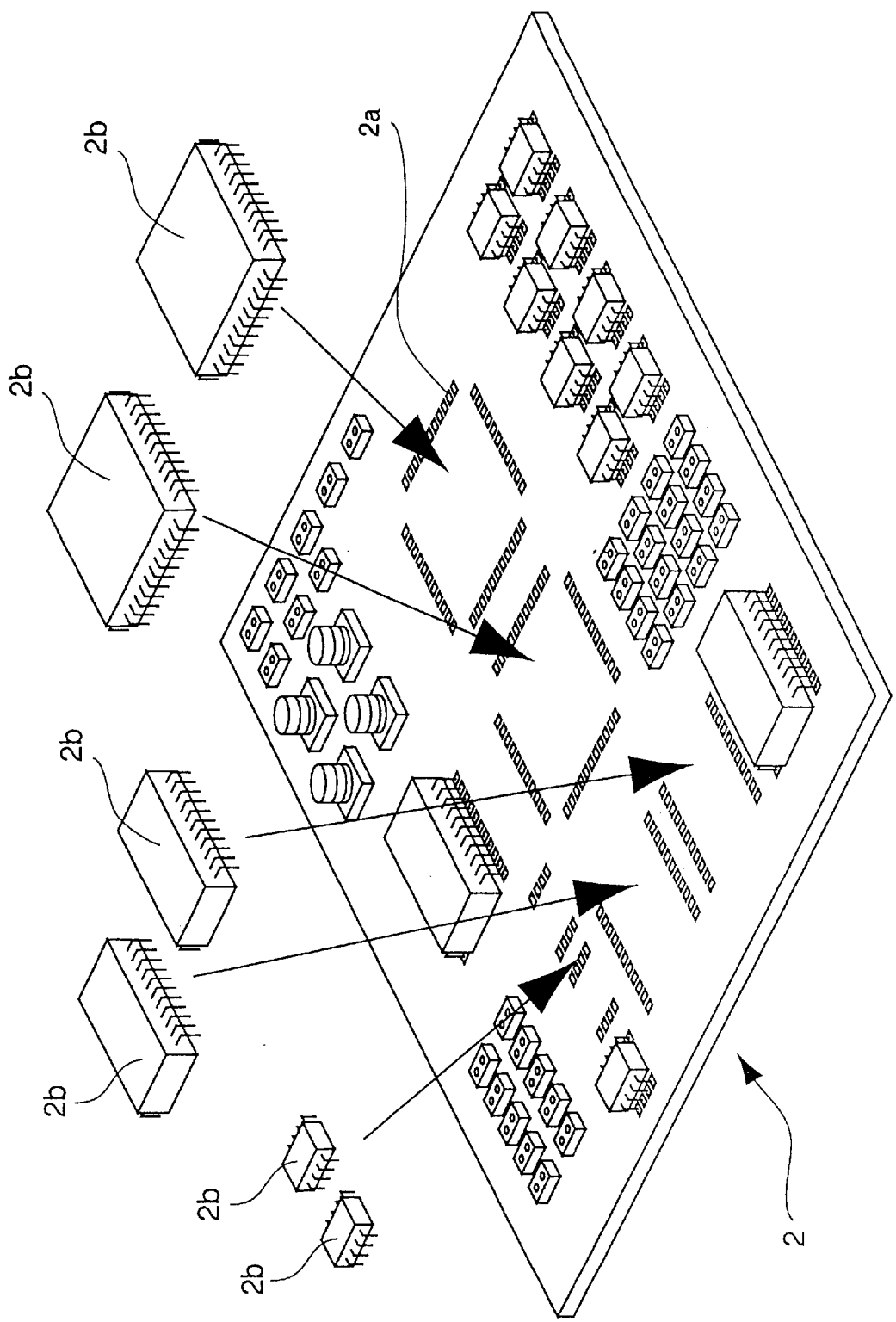
FIG. 2 is an enlarged view showing a printed-wiring board to be heated in the reflow furnace.

FIG. 2 is an enlarged view showing the printed-wiring board 2 to be heated in the reflow furnace. The printed-wiring board 2 has a structure in which a creamy soldering paste 2a is printed on a pattern for mounting components of the substrate and electronic components 2b are mounted on the soldering paste 2a. It is necessary to set, to the printed-wiring board 2, the same number of temperature detection points as that of the heating sources. Since the four heating sources are provided in the present embodiment, four temperature detection points are set.

The reason is as follows. In a case where reflow soldering is performed with the electronic components 2b mounted on the printed-wiring board 2, lead sections of large electronic components are heated with difficulty so that the soldering is easily uncompleted. Small electronic components are readily heated and subjected to thermal damages. Accordingly, points where importance should be attached to control of a reflow temperature are selected, and are numbered in order of importance. In this order, each temperature detection point is numbered.

When the reflow soldering is performed, the printed-wiring board 2 is put on the conveyer 3 and is carried from an inlet A toward an outlet B in the furnace casing 1 in a direction shown by an arrow D. In this carrying process, the printed-wiring board 2 is heated by radiation heat transferred from the heating source 1 (far-infrared radiation heater), the heating source 2 (near-infrared radiation heater) and the heating source 4 (near-infrared radiation heater) and hot air blowing from the heating source 2 (hot air fan heater) By the heating, the soldering paste printed on the printed-wiring board 2 is melted with a rise in the temperature of the printed-wiring board 2, and is carried to the outside of the furnace and exposed to a room temperature. Consequently, the melted soldering paste is cooled and solidified. Thus, the soldering is completed.

Figure 5:
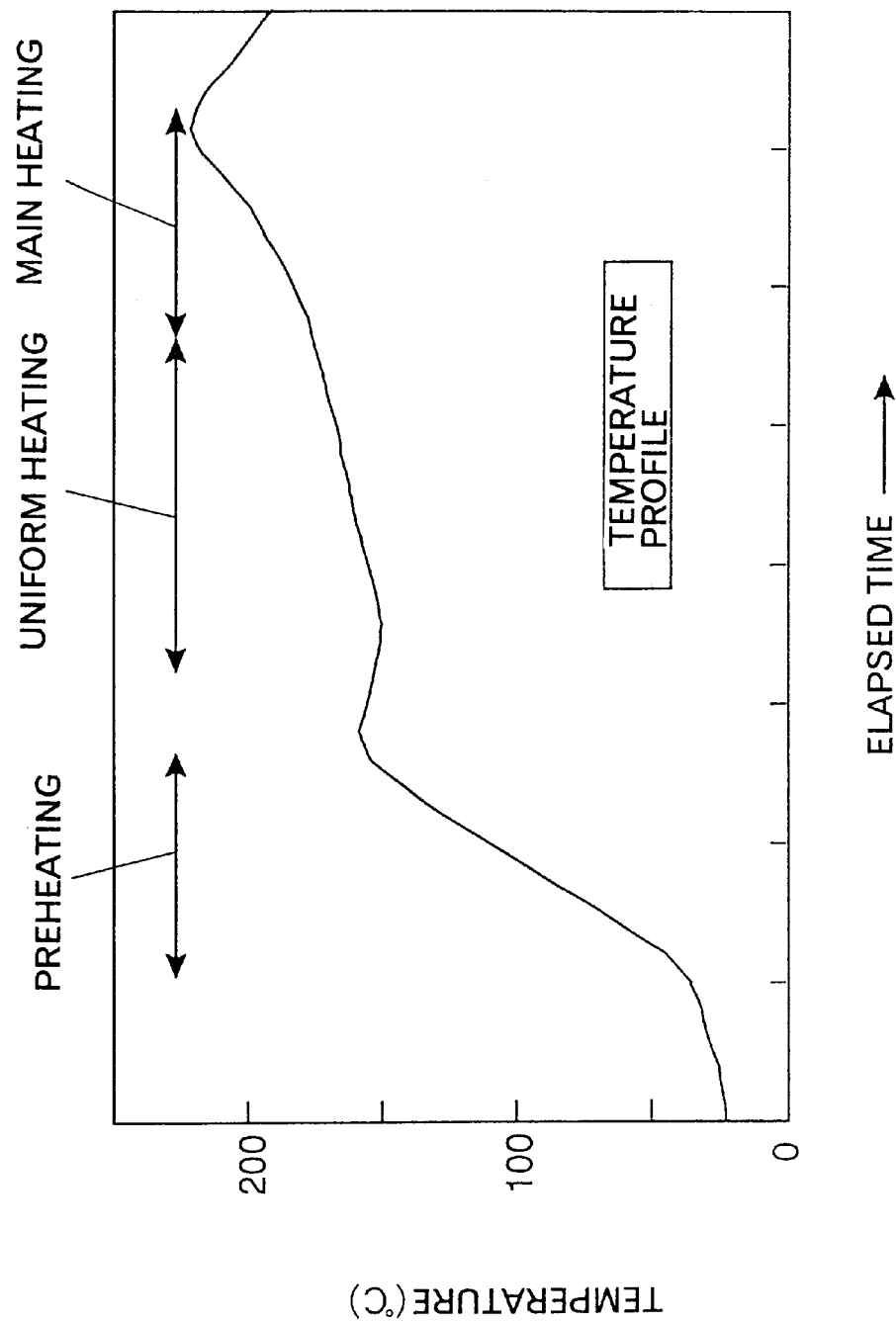
FIG. 5 is a graph showing an average temperature profile of the whole printed-wiring board.

At this time, the temperature of the printed-wiring board 2 is controlled to obtain the curve shown in the graph of FIG. 5 as described in the Description of the Related Art. More specifically, preheating, uniform heating and main heating are controlled in three stages. Thus, the temperature of the printed-wiring board 2 is not simply raised but the preheating is performed in order to lessen thermal damages on the printed-wiring board caused by rapid heating and the uniform heating for keeping the temperature of the printed-wiring board 2 constant is then carried out. For this reason, the four heating sources 1. to 4 having different properties are provided in the reflow furnace and the heating zone is divided into four portions. The solder is melted at a temperature of 200° C. or more. Therefore, a temperature on a peak point of the main heating is set to about 210° C. to which the printed-wiring board 2 is heated.

Figure 3:
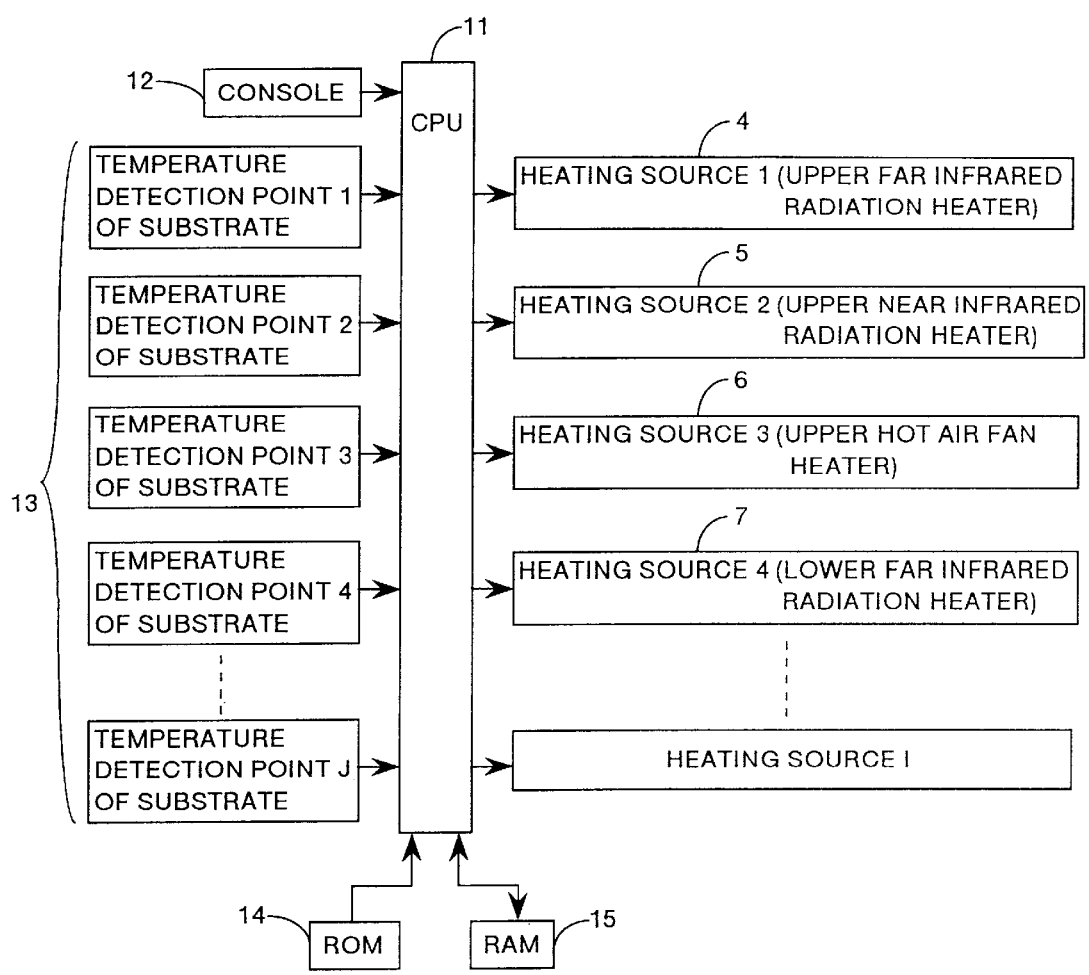
FIG. 3 is a block diagram showing a structure of a controller for setting reflow conditions of the reflow furnace.

FIG. 3 is a block diagram showing a structure of a controller for setting reflow conditions in the reflow furnace.

In FIG. 3, the reference numeral 11 denotes a CPU, the reference numeral 12 denotes a console for sending input data and control data to the CPU 11 and for monitoring I/O data, the reference numeral 13 denotes a temperature sensor for detecting the temperature of the printed-wiring board 2, the reference numeral 14 denotes a ROM for storing a control program of the CPU 11 which will be described below, and the reference numeral 15 denotes a RAM for temporarily storing data.

The temperature detection points 1 to 4 are set to the printed-wiring board 2 as described above. Temperatures at the temperature detection points 1 to 4 are detected by the temperature sensor 13 and are input to the CPU 11. The temperatures are actually detected by attaching the temperature sensor such as a thermoelectric couple to the printed-wiring board 2.

The temperatures at the temperature detection points 1 to 4 are not actually measured but may be obtained by performing thermal analysis based on computation. In a case where the temperatures are to be obtained by the calculation, it is possible to apply the thermal analyzing method described in the Japanese Laid-Open Patent Publication No. Hei 8-152377 filed on Jun. 13, 1996 by the present applicant and a method using a thermal analyzer according to a second embodiment which will be described below.

In the case where the temperatures are to be obtained by the computation, it is possible to automatically select a minimum temperature point of the lead section which requires heating enough for the soldering and maximum temperature points of small chip components and the substrate which should keep heating to a required minimum because they are easily subjected to thermal damages.

The CPU 11 receives data on the detected temperatures at the temperature detection points 1 to 4, sets heating conditions for the heating sources 1 to 4 based on the data and controls the heating sources 1 to 4. While the temperature detection points of the printed-wiring board and the heating sources have been indicated at 1 to 4 in the present embodiment, a large number of temperature detection points 1 to J and heating sources 1 to I (I=J) may be set.

The contents of processing operation of the CPU 11 will be described according to a flowchart shown in FIG. 4. In the following description, it is assumed that optional numbers of temperature detection points of the printed-wiring board 2 and heating sources are set.

Figure 4:
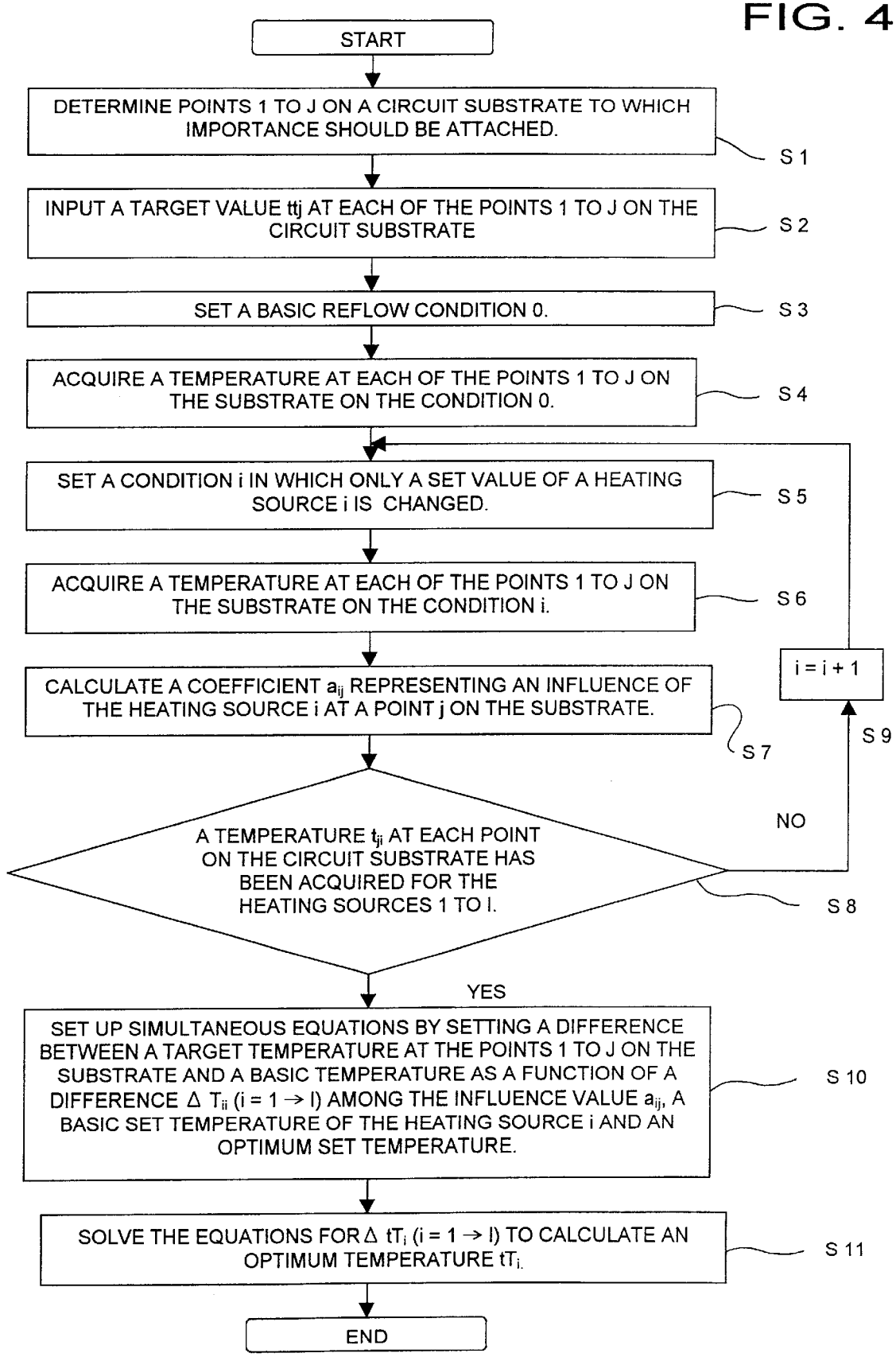
FIG. 4 is a flowchart showing contents of processing operation of a CPU.

As shown in FIG. 4, reflow conditions are set in the following manner.

At Step S1, the temperature detection points 1 to J where importance should be attached to the control of a reflow temperature on the printed-wiring board (circuit substrate) are determined. In a case where I heating sources are provided, I temperature detection points are selected from the printed-wiring board 2.

As described above, the lead sections of the large electronic components are heated with difficulty. Therefore, soldering is easily uncompleted. Since the small electronic components are easily heated, they are readily subjected to thermal damages. Accordingly, each point is numbered in order of importance. In this order, the temperature detection points are indicated at 1 to J. In a case where I heating sources are provided, J is equal to I. Each numbered temperature detection point is indicated at j.

At Step S2, a target temperature $tt_j$ obtained during reflow at each temperature detection point j is input from the console 12 for the temperature detection points 1 to J on the printed-wiring board 2.

At Step S3, a basic reflow condition of each heating source i such as a heater temperature, a hot air temperature or the like is input. This condition is indicated at 0. A set value of the heating source i on the reflow condition 0 is indicated at $T_{i0}$.

At Step S4, a temperature $t_{j0}$ at each temperature detection point j on the basic reflow condition 0 is acquired for the temperature detection points 1 to J on the printed-wiring board 2. In the present embodiment, thermal analysis for the printed-wiring board 2 is performed to obtain the temperature $t_{j0}$ from a result of the thermal analysis.

At Step 5, only a set value of one heating source i is changed by setting a basic reflow condition. This condition is indicated at i. The set value is changed in such a manner that the temperature of the printed-wiring board 2 approaches a target value as much as possible. The set value of the heating source i on the reflow condition i is indicated at $T_{ii}$.

At Step S6, a temperature distribution of the printed-wiring board 2 is acquired on the reflow condition i which has been changed at the Step S5. In other words, a temperature $t_{ji}$ at each temperature detection point j is acquired. In the same manner as in the Step S4, the thermal analysis is performed to obtain a temperature $t_{ji}$ at the temperature detection point j on the reflow condition i.

At Step S7 are calculated a variation $\Delta t_{ji}$ between the temperature $t_{jo}$ on the reflow condition 0 and the temperature $t_{ji}$ on the reflow condition i at the temperature detection point j and a variation $\Delta T_{ii}$ between the set value $T_{i0}$ on the reflow condition 0 and the set value $T_{ii}$ on the reflow condition i in the heating source i. By the following equation, a coefficient $a_{ij}$ related to the variation $\Delta T_{ii}$ in the set value of the heating source i and the variation $\Delta t_{ji}$ in the temperature at the temperature detection point j is calculated.

$$a_{ij}=\Delta t_{ji}/\Delta T_{ii}$$

At Step S8, it is decided whether or not works from the Step S5 to the Step S7 have been performed for all the heating sources 1 to I. If the works have not been performed for all the heating sources, the routine proceeds to Step S9 where the heating source i to change the reflow condition from 0 to i is set. In other words, the next heating source i to be an object is set and the routine returns to the Step S5. After the works from the Step S5 to the Step S7 are completed for all the heating sources i, the routine proceeds to Step S10.

At the Step S10, the following simultaneous equations related to a difference $\Delta tt_j$ between the target temperature $tt_j$ at the temperature detection point j and the temperature $t_{j0}$ on the reflow condition 0 are set up based on a variation $\Delta tT_i$ between a set value $tT_i$ of each of the heating sources 1 to I for causing the temperature detection point j to have a target temperature and the set value $T_{i0}$ on the reflow condition 0, and the coefficient $a_{ij}$ obtained at the Step S7.

$$\Delta tt_1=a_{11}\times\Delta tT_1+a_{21}\times\Delta tT_2+a_{31}\times\Delta tT_3+\ldots+a_{i1}\times\Delta tT_{i1}+\ldots+a_{I1}\times\Delta tT_{I1}$$

$$\Delta tt_2=a_{12}\times\Delta tT_1+a_{22}\times\Delta tT_2+a_{32}\times\Delta tT_3+\ldots+a_{i2}\times\Delta tT_{i2}+\ldots+a_{I2}\times\Delta tT_{I2}$$

$$\ldots$$

$$\Delta tt_j=\ldots$$

$$\ldots$$

$$\Delta tt_J=\ldots \qquad [\text{Equation 1}]$$

At Step S11, these simultaneous equations are solved for $\Delta tT_i$. The set value $tT_i$ on the optimum reflow condition of each heating source i on which the temperature detection point j has the target temperature $tt_j$ can unconditionally be calculated by the following equation.

$$tT_i=\Delta tT_i+T_{i0}$$

If four heating zones are provided as shown in FIG. 1, for example, the work is performed for the four heating zones so that the heating sources 1 to J in each heating zone such as an infrared heater, a hot air fan heater and the like can be set to the optimum heating conditions. Consequently, the optimum reflow conditions for the printed-wiring board 2 to be the object can be set to perform excellent reflow soldering.

Thus, the temperature at each temperature detection point is obtained for each heating source when heating is performed on an optionally initial condition and when only setting of one heating source is changed on the optionally initial condition. The influence of the heating performed by the heating source at the temperature detection point is known based on the variations in these temperatures. Consequently, it is possible to obtain the set value of the optimum reflow condition of each heating source for causing the temperature detection point to have the target temperature.

Thus, the relationship between the variation in the setting of the heating source and the variation in the temperature at the temperature detection point is grasped. Therefore, the setting of the heating source for causing the temperature detection point to have the target temperature can unconditionally be determined. The optimum heating conditions for minimizing a difference in the temperature in the printed-wiring board can be set in such a manner that thermal damages are kept to a minimum on the small electronic components mounted on the printed-wiring board and solderability onto the large electronic components is not deteriorated.

Also in the reflow furnace in which a plurality of heating sources are provided, accordingly, it is not necessary to change the setting of the heating conditions limitlessly by a worker's perception or guess. In addition, workers other than the skilled in the art can set the optimum heating conditions in a required minimum time and work.

Second Embodiment

As a second embodiment, a thermal analyzer for an object (a printed-wiring board) to be heated in a reflow furnace and a processing to be performed by the thermal analyzer will be described below.

Figure 6:
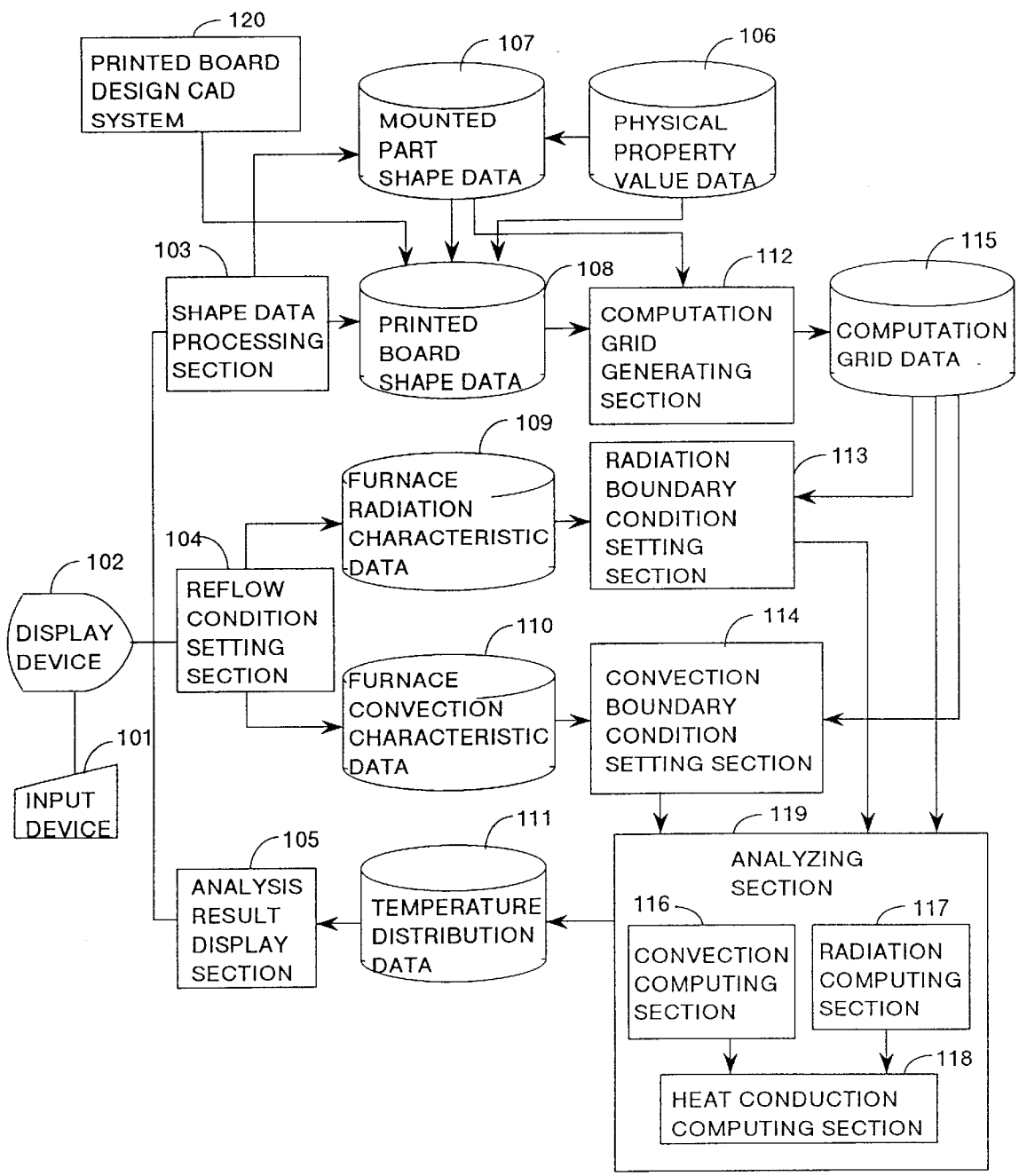
FIG. 6 is a block diagram showing a structure of a thermal analyzer for an object to be heated in a heating furnace according to the present invention.

FIG. 6 is a block diagram showing a structure of the thermal analyzer for the object in the heating furnace according to the present invention. Since the thermal analyzer for the object in the heating furnace according to the present invention uses a CPU, it will be hereinafter referred to as a thermal analyzing system. There will be described, as an example, thermal analysis in which a reflow furnace is applied as the heating furnace and a printed-wiring board (which is also referred to as a printed board or a substrate) having electronic components mounted thereon is applied as the object. More specifically, description will be given on the assumption that the thermal analyzing system widely performs the thermal analysis for the printed-wiring board during reflow heating. Hardware of the thermal analyzer can serve as a computer and an I/O device which have been used in the apparatus for setting heating conditions according to the first embodiment.

As shown in FIG. 6, the thermal analyzing system comprises an input device 101, a display device 102, a shape data processing section 103, a reflow condition setting section 104, an analysis result display section 105, a physical property value data storing section 106, a mounted component shape data storing section 107, a printed board shape data storing section 108, a furnace radiation characteristic data storing section 109, a furnace convection characteristic data storing section 110, a temperature distribution data storing section 111, a computation grid generating section 112, a radiation boundary condition setting section 113, a convection boundary condition setting section 114, a computation grid data storing section 115, and an analyzing section 119.

The analyzing section 119 includes a convection computing section 116, a radiation computing section 117 and a heat conduction computing section 118.

The input device 101 is used for inputting various data and various processing commands. The display device 102 displays an input state of various data and various processing states. The shape data processing section 103 fetches shapes of the substrate and the mounted components, positions of the components mounted on the substrate and the like, changes contents and updates contents stored in the mounted component shape data storing section 107 and the printed board shape data storing section 108.

Figure 7:
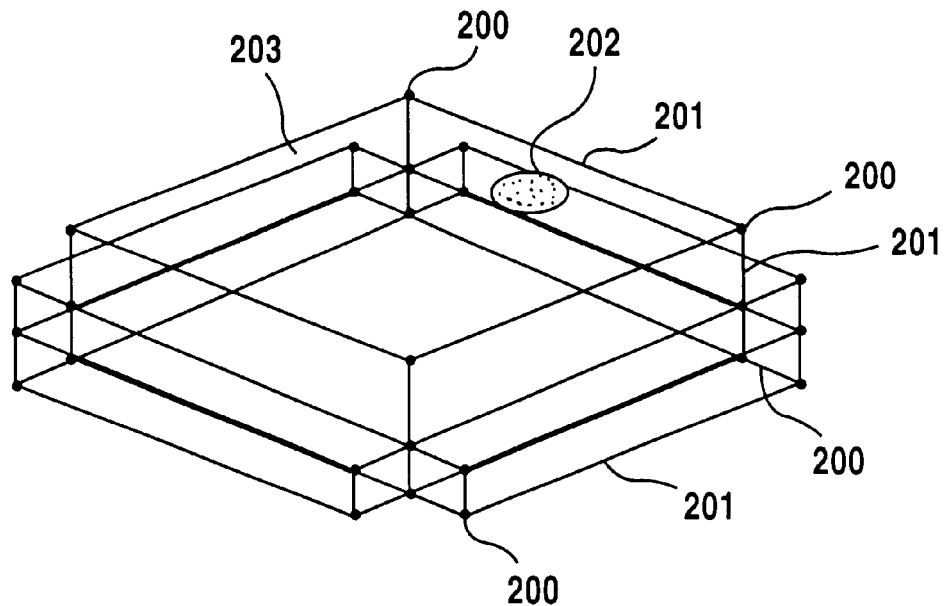
FIG. 7 is a view illustrating an example of mounted component shape data stored in a mounted component shape data storing section according to the present invention.

Mounted component shape data stored in the mounted component shape data storing section 107 include a plurality of data indicative of coordinates on a three-dimensional space as shown in FIG. 7. The mounted component shape data have a straight line 201 formed by a point 200, a face 202 formed by a group of straight lines, and a block 203 formed by faces. Physical properties such as specific heat, density, heat conductivity, infrared absorptance and the like are given from the physical property value data storing section 106 to each block 203 forming the shape of the mounted component.

Figure 8:
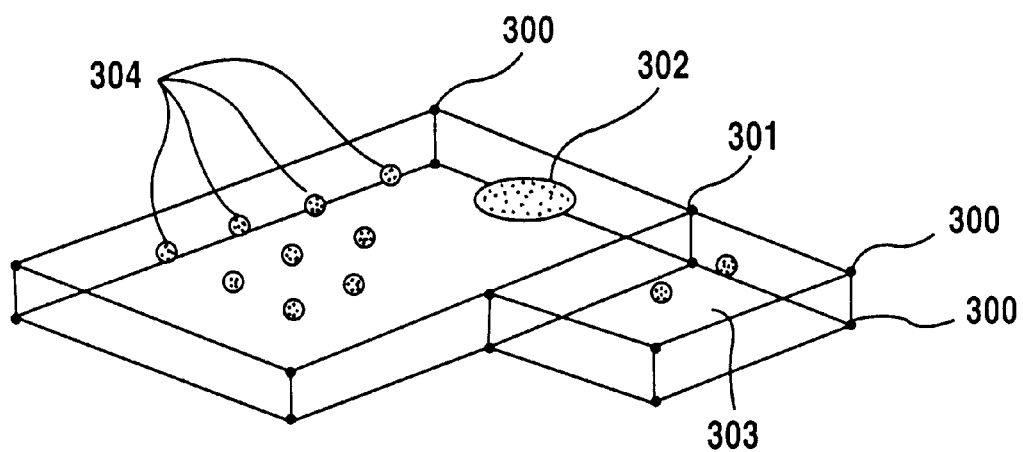
FIG. 8 is a view illustrating an example of printed board shape data stored in a printed board shape data storing section according to the present invention.

As shown FIG. 8, printed board shape data stored in the printed board shape data storing section 108 include substrate shape data indicative of the coordinates on the three-dimensional space, names of the components stored in the mounted component shape data storing section 107, and coordinate data 304 on the three-dimensional space on which the components are provided. The substrate shape data have a straight line 301 formed by a point 300, a face 302 formed by a group of straight lines and a block 303 formed by faces. Physical properties such as specific heat, density, heat conductivity, infrared absorptance and the like are given from the physical property value data storing section 106 to each block 303 forming the shape of the substrate.

The printed board shape data may be fetched from a printed board design CAD system 120 for fabricating a printed-wiring board.

The printed board shape data stored in the printed board shape data storing section 108 is fetched into the computation grid generating section 112. The computation grid generating section 112 refers to the names of the components in the printed board shape data, reads the shapes of the mounted components from the mounted component shape data storing section 107, and adds the shapes of the mounted components into the positions on the substrate where the components in the printed board shape data are mounted. Next, the computation grid generating section 112 generates a computation grid for the shape of the printed-wiring board on which the components are mounted, and defines a physical property value for each computation element divided by the computation grid. The computation grid is generated by a well-known method.

The reflow condition setting section 104 fetches an internal structure of the reflow furnace, the size, arrangement and temperature setting of each heater, a position of a blow-off port of each blower, a set temperature of the blower, a carrying speed of a conveyer belt and the like which are input from the input device 101, and causes the display device 102 to echo-display them.

The reflow condition setting section 104 causes the furnace radiation characteristic data storing section 109 to store information necessary for radiation heat transfer computation such as an area of the heater, a temperature thereof, a position relationship with the printed-wiring board and the like, causes the furnace convection characteristic data storing section 110 to store information necessary for convection heat transfer computation such as a convection heat transfer coefficient and an atmospheric temperature and the like, and updates the contents of the input information.

The radiation characteristic data and the convection characteristic data which are stored in the furnace radiation characteristic data storing section 109 and the furnace convection characteristic data storing section 110 are fetched into the radiation boundary condition setting section 113 and the convection boundary condition setting section 114, respectively. Thus, a radiation boundary condition and a convection boundary condition are set on a predetermined boundary surface of the computation grid of the computation grid data storing section 115.

The radiation boundary condition implies a heat quantity transferred by radiation which is expressed by the following equation:

$$q_{RAD}=F \cdot \sigma \cdot A(T_H^4 - T_P^4)$$

wherein F represents a Radiation shape factor indicative of an extent of influence of the radiation, $\sigma$ represents a Stefan-Boltzmann coefficient, A represents an area of one mesh of the printed-wiring board which is cut into a grid shape, $T_H$ represents a temperature of a heater [K (absolute temperature)], and $T_P$ represents a temperature of the printed-wiring board [K (absolute temperature)].

The convection boundary condition implies a heat quantity transferred by a convection which is expressed by the following equation:

$$q_{cov}=h \cdot A(T_A - T_P)$$

wherein h represents a convection coefficient which is related to a wind speed of the blower, A represents an area of one mesh of the printed-wiring board cut into a grid shape, $T_A$ represents an atmospheric temperature [° C. (centigrade)] and $T_P$ represents a temperature of the printed-wiring board [° C. (centigrade)].

Accordingly, both heat quantities on the radiation boundary condition and the convection boundary condition are obtained as follows.

$$Q=q_{RAD}+q_{cov}$$

The analyzing section 119 reads the computation grid stored in the computation grid data storing section 115, and performs a thermal analysis processing based on the radiation boundary condition output from the radiation boundary condition setting section 113 and the convection boundary condition output from the convection boundary condition setting section 114.

In a case where the printed-wiring board is carried by means of the conveyer belt in the furnace so that the radiation boundary condition and the convection boundary condition are changed with a passage of time, the radiation computing section 117 and the convection computing section 116 in the analyzing section 119 compute the radiation boundary condition and the convection boundary condition for each elapsed time again and the heat conduction computing section 118 calls results of the computation output from the radiation computing section 117 and the convection computing section 116, thereby performing heat conduction analysis for the printed-wiring board in each position in the reflow furnace. After the analysis is completed, a result of the analysis is stored in the temperature distribution data storing section 111.

The analysis result display section 105 calls temperature distribution data of the printed-wiring board from the temperature distribution data storing section 111, and performs a graphic processing to cause the display device 102 to display the processed data.

Figure 9:
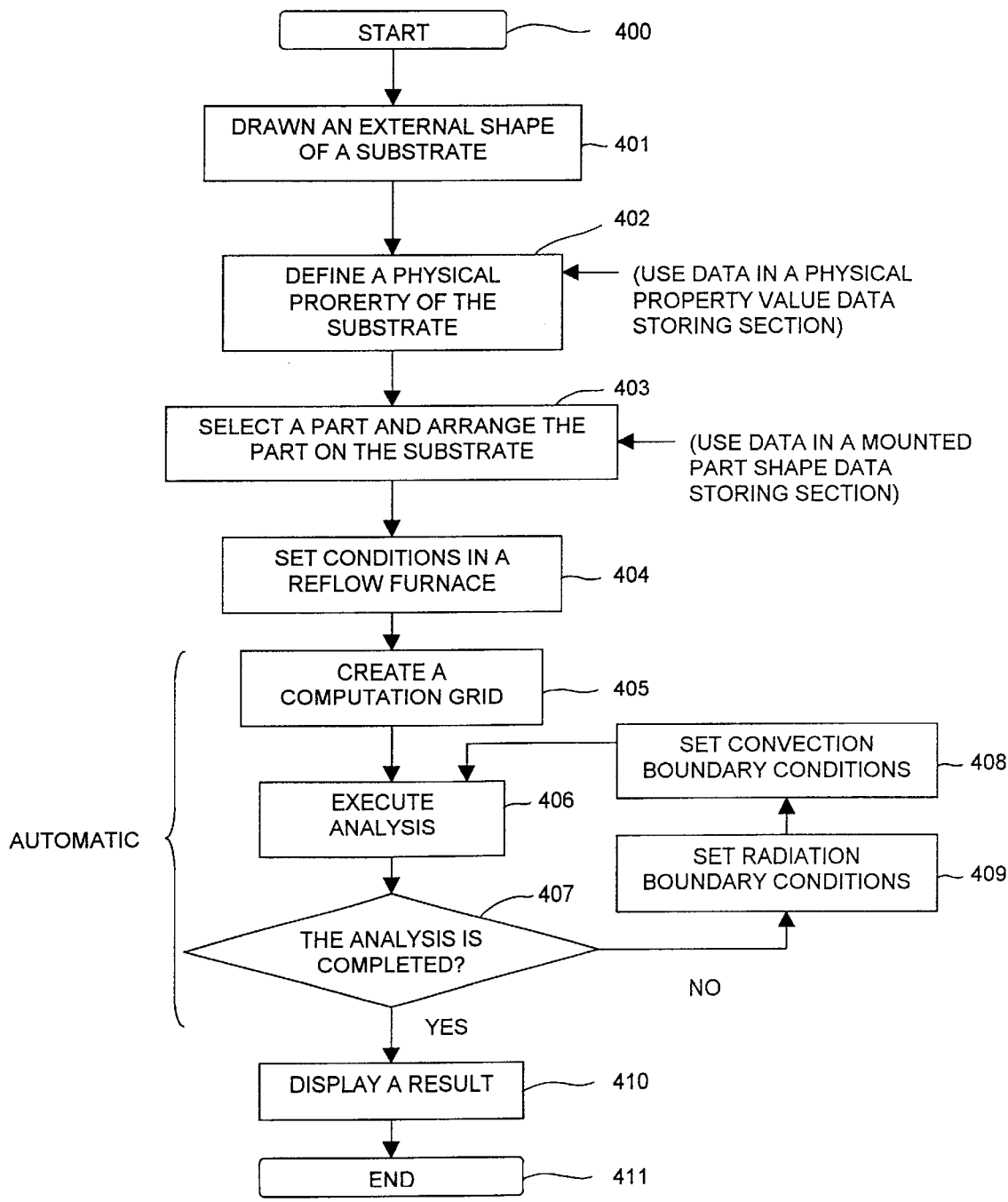
FIG. 9 is a flowchart showing the contents of a processing to be performed by a thermal analyzing system according to the present invention.
Figure 10:
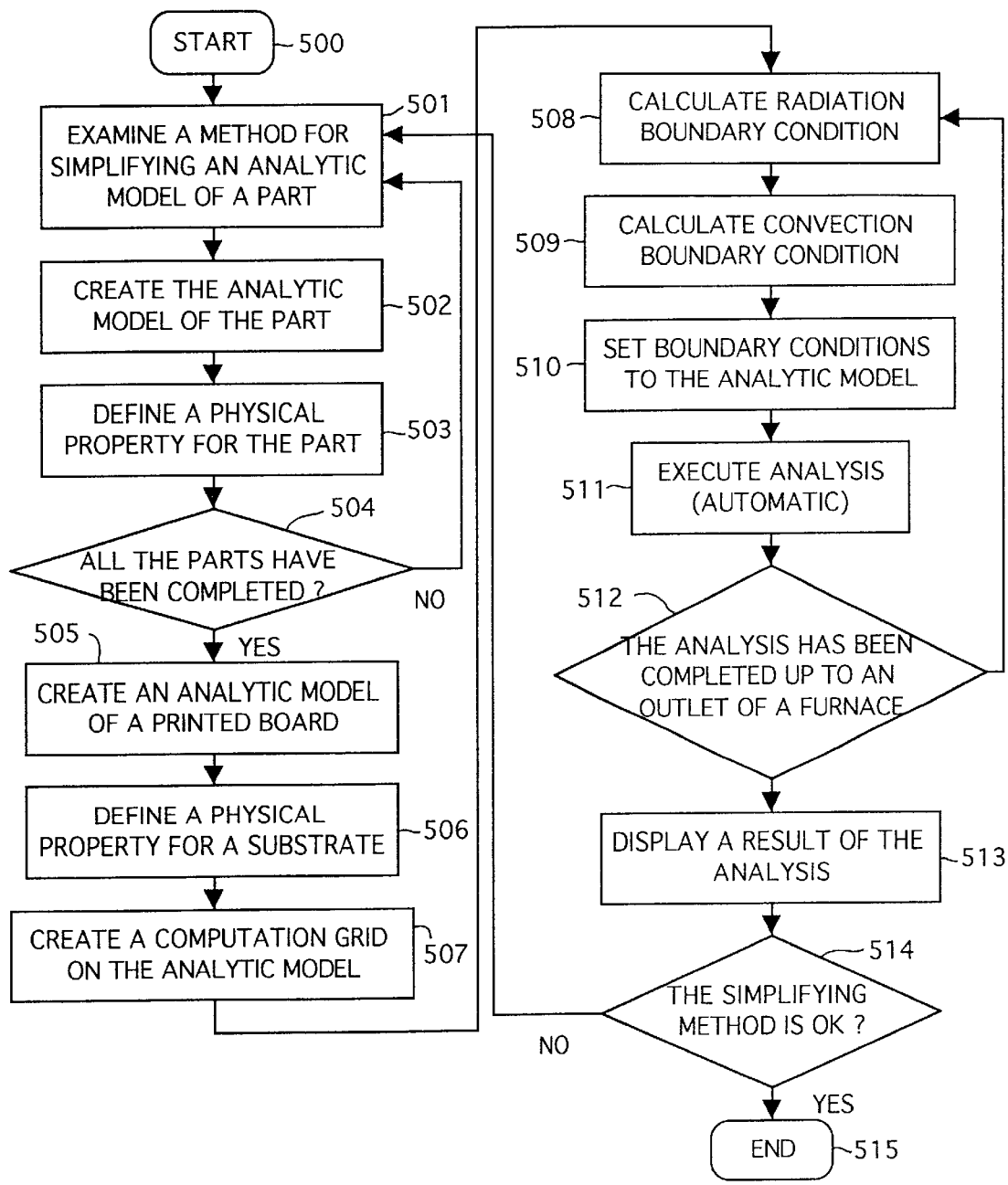
FIG. 10 is a flowchart showing a processing of performing thermal analysis for the printed-wiring board in the reflow furnace by using the prior art.

The thermal analyzing system has the above-mentioned structure. Next, the contents of the processing to be performed in the thermal analyzing system according to the present invention will be described below with reference to a flowchart shown in FIG. 9.

First of all, an external shape of the substrate (printed-wiring board) on which components are mounted is input at Step 401. A shape display processing in a computer is easy to perform. Therefore, the substrate can be treated as a two-dimensional shape. The shape may be input by using a pointing device.

Next, the physical property of the substrate is defined at Step 402. The physical property of the substrate is stored in the physical property value data storing section 106 and can be selected therefrom for definition.

Then, the components are arranged on a shape model of the substrate which has been created at Step 403. A shape of the component which has previously been simplified optimally is stored in the mounted component shape data storing section 107, and is selected therefrom and arranged on the substrate. A shape of a novel component which has not been stored in the mounted component shape data storing section 107 is newly created, and is registered in the mounted component shape data storing section 107 for repetitive use.

By the above-mentioned process, the analytic shape of the printed-wiring board is completely formed.

Then, the heat conditions in the reflow furnace are set at Step 404. At this step, a position of the heater in the reflow furnace, a set temperature of each heater, a position of each blower and a set temperature thereof, and a speed of a belt conveyer carrying the printed-wiring board are input. At the Steps 401 to 404, manual setting is required. The subsequent steps are automatically executed in the thermal analyzing system.

First of all, a computation grid is automatically created for the analytic shape at Step 405. Based on the heating conditions in the reflow furnace set at the Step 404, radiation boundary conditions and convection boundary conditions are automatically set to the computation grid.

At Step 406, heat conduction analysis is performed for the printed-wiring board based on the set boundary conditions. The boundary conditions are changed by movement of the printed-wiring board in the furnace. Therefore, the analysis is once stopped at Step 407. If the analysis is not completed up to an outlet of the furnace, the radiation boundary conditions and the convection boundary conditions are reset at Steps 408 and 409, thereby starting the heat conduction analysis again.

Finally, the temperature distribution data of the printed-wiring board which has been subjected to the graphic processing is displayed on the display device 102 at Step 410. Consequently, a worker for performing the analysis can obtain the result of the thermal analysis for the printed-wiring board.

In the present embodiment, the worker for performing the analysis can easily form the shape of the printed-wiring board by arranging, on the substrate, electronic components having three-dimensional shapes which have previously been stored in a database and simplified optimally, and can automatically set the computation grid for the three-dimensional shape.

The radiation boundary conditions and the convection boundary conditions which are changed with a passage of time in the heating furnace are automatically set every constant time. Based on these boundary conditions, therefore, the thermal analysis is automatically performed every constant time for the analytic model of the printed-wiring board which has the computation grid created. Thus, a temperature profile for each computation grid of the printed-wiring board can be calculated.

Accordingly, a user can easily perform the thermal analysis for the printed-wiring board in the reflow furnace by using the thermal analyzing system. Consequently, the following excellent effects can be obtained.

(1) The analytic model of the printed-wiring board can be created in a short time without requiring technical knowledge.

(2) During the thermal analysis, it is not necessary to reset, every constant elapsed time, the radiation boundary conditions and the convection boundary conditions which are changed by the movement of the printed-wiring board in the furnace.

Third Embodiment

As a third embodiment, a method for modeling thermal analysis of an object (a printed-wiring board) to be heated in a reflow furnace will be described below. An analytic model according to the present embodiment acts as an analytic model of the printed-wiring board including two or more layered computation elements having the same thickness as in a substrate on one face or both faces of the substrate.

Hardware which is directly used for executing the modeling method can serve as a computer and an I/O device used in the apparatus for setting heating conditions according to the first embodiment or as a computer and an I/O device used in the thermal analyzer according to the second embodiment.

Figure 11A:
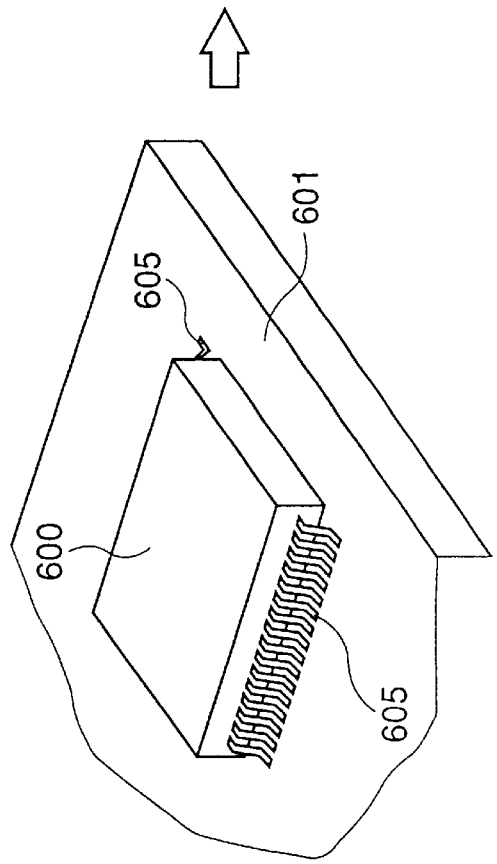
FIGS. 11(a) and 11(b) are views illustrating states of an actual printed-wiring board and a modeled printed-wiring board, respectively.
Figure 11B:
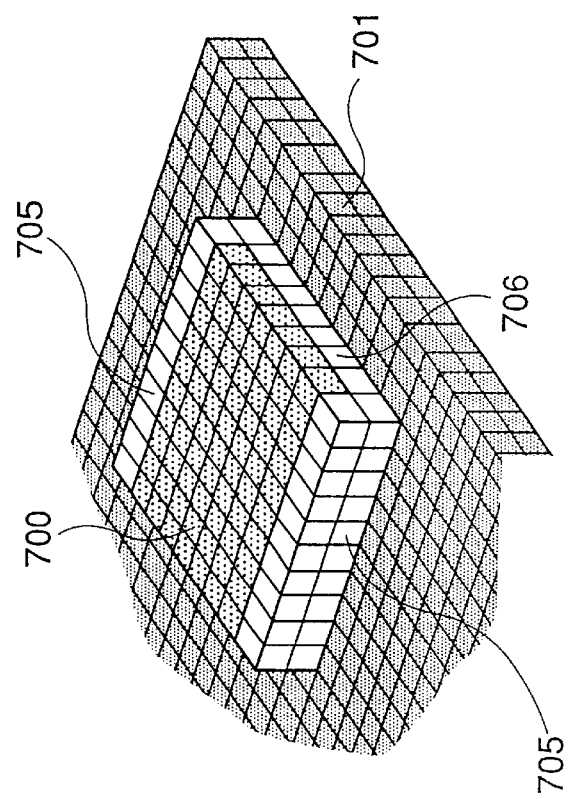

For modeling the printed-wiring board when performing heat conduction analysis by using a difference method, an analytic model having a simplified shape of the printed-wiring board was used as shown in FIGS. 11(a) and 11(b).

FIG. 11(a) is a partially perspective view showing an actual printed-wiring board, and FIG. 11(b) is a partially perspective view showing the modeled printed-wiring board. In FIG. 11(a), the reference numeral 601 denotes an actual substrate, the reference numeral 600 denotes an actual component, and the reference numeral 605 denotes an actual lead. In FIG. 11(b), the reference numeral 701 denotes a modeled substrate, the reference numeral 700 denotes a modeled component, the reference numeral 705 denotes a modeled lead and the reference numeral 706 denotes a modeled air layer between the substrate and the component, all of which are rectangular prism models.

Figure 12:
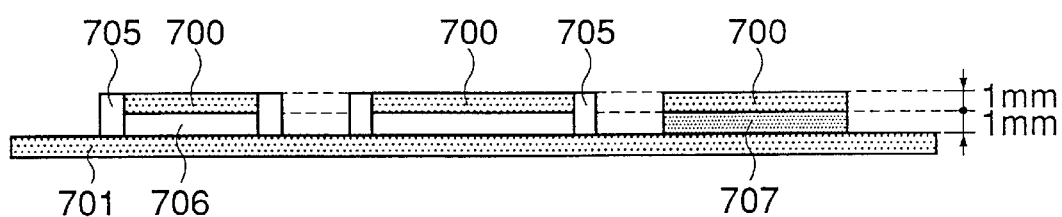
FIG. 12 is a view illustrating a state of the modeled printed-wiring board seen from a side.

FIG. 12 is a view illustrating a state of the modeled printed-wiring board seen from a side. In FIG. 12, the reference numeral 701 denotes an analytic model of the substrate (a substrate model) which corresponds to the modeled substrate shown in FIG. 11(b). The reference numeral 700 denotes an analytic model of a component body such as a SOP, a QFP or a PGA (a component model) which corresponds to the modeled component shown in FIG. 11(b). The reference numeral 705 denotes an analytic model of the lead of the component (a lead model) which corresponds to the modeled lead shown in FIG. 11(b). The reference numeral 706 denotes an analytic model of a gap between the substrate and the component (a gap model) which corresponds to the modeled air layer between the substrate and the component shown in FIG. 11(b). The reference numeral 707 denotes an analytic model of a pin-shaped connecting terminal (a connecting terminal model).

Figure 13:
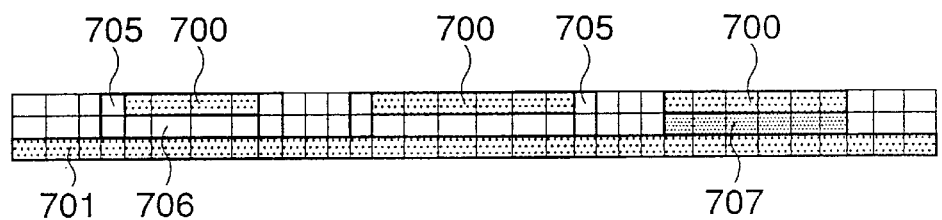
FIG. 13 is a view illustrating a case where a computation grid to perform difference analysis for an analytic model shown in FIG. 12 is created.

FIG. 13 illustrates a case where a computation grid for performing difference analysis is created on the analytic model in FIG. 12.

In order to reduce the number of computation elements for difference computation as much as possible and to increase a dimension of the computation element, the printed-wiring board is divided into three layers (two component layers+one substrate layer) in a direction of a thickness thereof when components are mounted on only one face. As shown in FIG. 13, the printed-wiring board is divided into the three portions in the direction of the thickness thereof. Irrespective of the kind, shape, size (height) and the like of the components, therefore, each of the analytic models of all the components is divided into two layers in a direction of a thickness thereof, upper and lower layers having a thickness of 1 mm in respect of analysis.

The components having different thicknesses have heat capacities varied. For this reason, also in a case where the same structure and material are used, a temperature difference is made during reflow heating. However, the height and the thicknesses of the upper and lower layers are uniform in respect of the analysis as described above. Therefore, a temperature difference is not made between both components. In order to consider a temperature difference made by the actual height of the component and the actual thickness of the component body with a height of each component model and a thickness of each layer kept uniform, physical property values such as specific heat and density (specific heat×density=heat capacity) defined on the upper and lower layers for each component model in respect of the analysis were corrected according to the height of the component and the thickness of the component body. The physical property value defined in each portion of the component will be described below.

The heat capacity of the component model 700 was corrected to be great when the actual thickness of the component body was greater than a thickness (1 mm) of the component model 700, and was corrected to be small when the actual thickness of the component body was smaller than the thickness (1 mm) of the component model 700. The heat capacity of the component model 700 was corrected by the following equation.

$$BQ_m = BQ_r \times (BT_r / BT_m)$$

$BQ_m$: A heat capacity of the component model $BQ_r$: An actual heat capacity of the component body $BT_r$: An actual thickness of the component body $BT_m$: A thickness of the upper layer of the component model (1 mm)

In a case where the actual thickness of a gap between the substrate and the component was greater than that of the gap model 706 (1 mm) between the substrate and the component, the heat capacity of the gap model 706 between the substrate and the component was corrected to be great. In a case where the actual thickness of the gap between the substrate and the component was smaller than that of the gap model 706 (1 mm) between the substrate and the component, the heat capacity of the gap model 706 between the substrate and the component was corrected to be small. The heat capacity set to the gap model 706 between the component and the substrate was corrected by the following equation.

$$GQ_m = GQ_r \times (GT_r / GT_m)$$

$GQ_m$: A heat capacity of the gap model $GQ_r$: An actual heat capacity of the gap $GT_r$: An actual thickness of the gap $GT_m$: A thickness of the gap model (1 mm)

A temperature difference in the direction of the thickness of the substrate is much smaller than a temperature difference between the component and the substrate and a temperature difference in a direction of a plane of the substrate. Therefore, a temperature distribution in the direction of the thickness of the substrate can be ignored. In order to make the number of computation elements as small as possible and to keep dimensions of the computation elements great, the substrate model 701 is divided into one portion in the direction of the thickness. While the upper and lower layers of the component model 700 have a thickness of 1 mm, the actual substrate 601 has a thickness of about 1 mm. Therefore, the thickness of the substrate model 701 is set equal to the thickness of the actual substrate 601. Volumes of the actual substrate 601 and the substrate model 701 are equal to each other. For this reason, the physical property values are not corrected.

Figure 14:
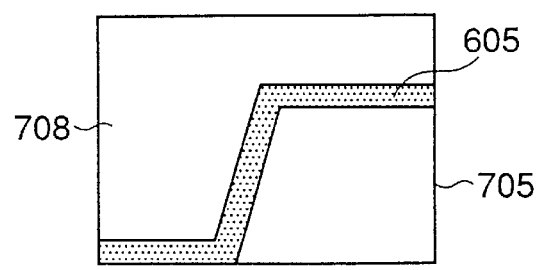
FIG. 14 is a view illustrating a comparison between a shape of an actual lead and that of a lead model.

Next, the heat capacity defined on the lead model 705 will be described. FIG. 14 illustrates a comparison between a shape of the actual lead 605 and that of the lead model 705. As shown in FIG. 14, the size of the lead model 705 is greater than that of the actual lead 605, and the lead model 705 is a rectangular prism including the actual lead 605 and a space surrounding the lead 605.

A height of the lead model 705 is set to 2 mm in such a manner that it is aligned with heights of analytic models of other components. The lead model 705 includes the actual lead 605 and air 708 surrounding the lead 605. The heat capacity of the lead model 705 was calculated based on a ratio of a volume of the actual lead 605 to that of the air 708 which are included in the lead model 705. The heat capacity defined on the lead model 705 was calculated by the following equation.

$$LQ_m = LQ_r \times (LC_r/LC_3) + AQ \times (AC/LC_m)$$

$LQ_m$: A heat capacity of the lead model
$LQ_r$: An actual heat capacity of the lead
$LC_r$: An actual volume of the lead in the model
$LC_m$: A volume of the lead model
AQ: A heat capacity of the air
AC: A volume of the air in the model In the same manner as the heat capacity of the lead model 705 described above, the heat capacity of the connecting terminal model 707 was calculated based on a ratio of a volume of a connecting terminal 607 to that of the air in the connecting terminal model 707.

Figure 15:
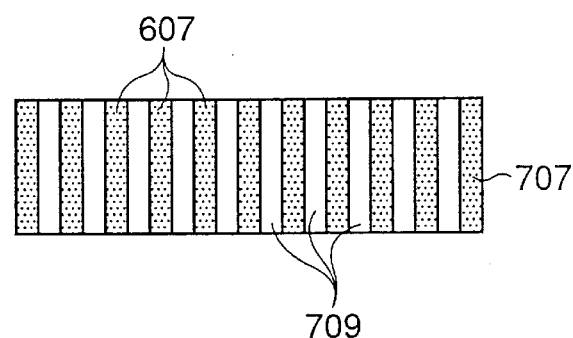
FIG. 15 is a view illustrating a comparison between a shape of an actual connecting terminal and that of a connecting terminal model.

FIG. 15 illustrates a comparison between a shape of the actual connecting terminal 607 and that of the connecting terminal model 707. As shown in FIG. 15, the connecting terminal model 707 is a rectangular prism including the actual connecting terminal 607 and a space between the connecting terminals 607. In other words, the connecting terminal model 707 includes the actual connecting terminal 607 and air 709 between the connecting terminals 607.

A height of the connecting terminal model 707 was set to 1 mm in order to be aligned with heights of other analytic models. In a case where the height of the actual connecting terminal 607 is greater than a height of the connecting terminal model 707 (1 mm), the heat capacity of the connecting terminal model 707 was corrected to be great. In a case where the height of the actual connecting terminal 607 is smaller than the height of the connecting terminal model 707 (1 mm), the heat capacity of the connecting terminal model 707 was corrected to be small. The heat capacity set to the connecting terminal model 707 was calculated by the following equation.

$$PQ_m = (PT_r/PT_m) \times \{PQ_r \times (PC_r/PC_m) + AQ \times (AC/PC_m)\}$$

$PQ_m$: A heat capacity of the connecting terminal model
$PT_r$: An actual thickness of the connecting terminal
$PT_m$: A thickness of the connecting terminal model (1 mm)
$PQ_r$: An actual heat capacity of the connecting terminal
$PC_r$: An actual volume of the connecting terminal in the model
$PC_m$: A volume of the connecting terminal model
AQ: A heat capacity of the air
AC: A volume of the air in the model The heat capacity can also be defined on models other than the component model such as a SOP, a QFP or a PGA, the gap model, the lead model and the connecting terminal model in the same way of thinking.

While the method for reducing the number of the computation grids to be created in the direction of the thickness of the printed-wiring board and for increasing a space between the computation grids has been described above, it is apparent that investigation has been performed to reduce, as much as possible, the number of the computation grids to be created in the direction of the plane of the printed-wiring board. In the present embodiment, a minimum space between the computation grids in the direction of the plane was set to 1 mm.

In the method for modeling the thermal analysis for the printed-wiring board according to the present invention described above, the space between the computation grids was increased so that the number of the computation elements can greatly be reduced and analysis computation can be performed in a shorter time than in a case where a conventional analytic model is used. Furthermore, the analytic model has very few errors caused by the modeling because the corrected physical property values are defined for use depending on an actual shape of a component (a height of a component and a thickness of a component body) and a material.

Figure 16:
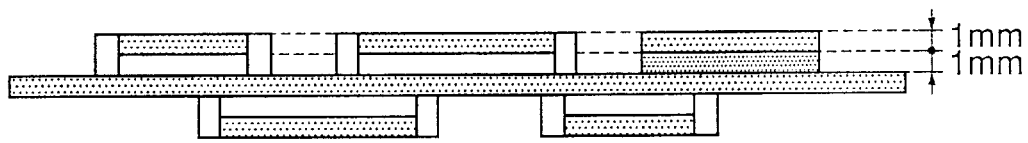
FIG. 16 is a view illustrating an analytic model of a double-sided mounting printed-wiring board.
Figure 17:
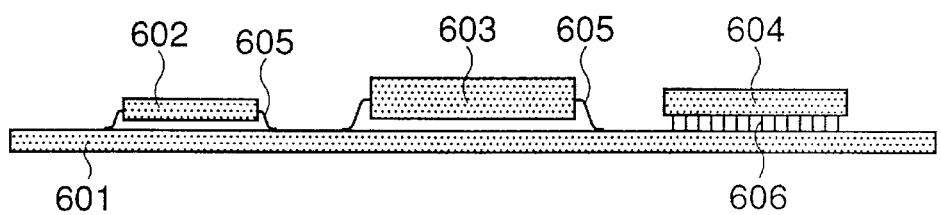
FIG. 17 is a view illustrating a state of the actual printed-wiring board seen from a side.
Figure 18:
FIG. 18 is a view illustrating a computation grid to perform thermal analysis for a printed-wiring board according to the prior art.

In the present embodiment, the analytic model of the single-sided mounting printed-wiring board having electronic components mounted on only one face of the substrate has been described. For the double-sided mounting printed-wiring board having electronic components mounted on both faces of the substrate, the analytic model of the printed-wiring board shown in FIG. 16 is used so that the number of the computation grids can be reduced and a space between the computation grids can be increased in the same manner as in the present embodiment. In the analytic model shown in FIG. 16, the number of divisions in the direction of the thickness of the printed-wiring board is set to 5 (surface component 2+substrate 1+back component 2).

It is apparent that the methods and apparatus according to the first, second and third embodiments can optionally be combined for use when the heating conditions in the reflow furnace are to be set.

According to the apparatus for setting heating conditions in the heating furnace in accordance with the present invention, a relationship between a variation in the heating conditions and a variation in a detected temperature at each detection point of an object to be heated is computed, and heating conditions for causing the detection point of the object to have a target temperature are then set. Therefore, the heating conditions are not repeatedly set limitlessly depending on workers' perception or guess, and workers other than the skilled in the art can set optimum heating conditions for the object such as a printed-wiring board in a required minimum time. For this reason, it is possible to smoothly start production of a novel printed-wiring board in a short time and minimum man-day, for example. The optimum heating conditions can also be set to the heating furnace to which a temperature is hard to set, for example, to the reflow furnace using heaters having various radiation characteristics which serve to selectively heat a substrate and components respectively.

According to the thermal analyzer for an object to be heated in the heating furnace in accordance with the present invention, a shape of the object and a physical property value thereof are input, and heating conditions in the heating furnace are input. Consequently, a temperature distribution for each computation grid can automatically be calculated for each movement of the object within a predetermined range based on radiation boundary conditions and convection boundary conditions of the object which are changed with a passage of time, and heat conduction in the object. Thus, thermal analysis can easily be performed for the object such as the printed-wiring board in the heating furnace.

In a case where a rectangular prism model having a great space between the computation grids is set to the printed-wiring board and physical property values are corrected for the rectangular prism model to apply actual physical property values to each rectangular prism model, the number of the computation elements can greatly be reduced and analysis computation can be performed in a shorter time than in a case where a conventional analytic model is used. In addition, the analysis can accurately be performed without errors caused by modeling.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What is claimed is:

1. A method for setting heating conditions in a heating furnace, comprising the steps of:

setting heating conditions to a plurality of heating sources respectively when heating an object to be heated by means of the heating sources in the heating furnace;

heating the object;

detecting a temperature of the heated object at a plurality of detection points;

computing, for each heating source, a relationship between a variation in the heating conditions in one of the heating sources and a variation in a detected temperature at each of the detection points of the object;

calculating heating conditions in the heating source for causing the detection point of the object to have a target temperature based on the computed relationship; and controlling the heating source on the calculated heating conditions, wherein the heating furnace is formed of a reflow furnace, the object is formed of a printed-wiring board having electronic components mounted thereon, the heating sources are formed of two or more electric heating sources of hot air blasting and heat radiation types, and the printed-wiring board is heated by simultaneously using the two or more electric heating sources of the different types.

2. An apparatus for setting heating conditions in a heating furnace, comprising:

setting means for setting heating conditions to a plurality of heating sources respectively when heating an object to be heated by means of the heating sources in the heating furnace;

detecting means for detecting a temperature of the heated object at a plurality of detection points;

computing means for computing, for each heating source, a relationship between a variation in the heating conditions in one of the heating sources and a variation in a detected temperature at each of the detection points of the object;

calculating means for calculating heating conditions in the heating source for causing the detection point of the object to have a target temperature based on the computed relationship; and control means for controlling the heating sources on the calculated heating conditions, wherein the heating furnace is formed of a reflow furnace, the object is formed of a printed-wiring board having electronic components mounted thereon, the heating sources are formed of two or more electric heating sources of hot air blasting and heat radiation types, and the printed-wiring board is heated by simultaneously using the two or more electric heating sources of the different types.

3. A computer readable recording medium which records a heating condition setting program in a heating furnace, causing a computer to execute the steps of:

setting heating conditions to a plurality of heating sources respectively when heating an object to be heated by means of the heating sources in the heating furnace;

detecting a temperature of the heated object at a plurality of detection points;

computing, for each heating source, a relationship between a variation in the heating conditions in one of the heating sources and a variation in a detected temperature at each of the detection points of the object;

calculating heating conditions in the heating source for causing the detection point of the object to have a target temperature based on the computed relationship; and controlling the heating sources on the calculated heating conditions.

4. A thermal analyzer for an object to be heated in a heating furnace, comprising:

object data input means for inputting a shape and a physical property value of the object moving in the heating furnace at a predetermined speed;

computation grid generating means for dividing the object in a grid shape to generate a computation grid and for defining a physical property value for each computation element divided by the computation grid;

heating condition input means for inputting heating conditions in the heating furnace;

setting means for setting, on the input heating conditions, a radiation boundary condition and a convection boundary condition of the object which are changed with a passage of time;

calculating means for calculating a temperature distribution for each computation element every movement of the object within a predetermined range based on the radiation boundary condition and the convection boundary condition which are set by the setting means and heat conduction in the object for each computation element generated by the computation grid generating means; and output means for outputting the temperature distribution calculated by the calculating means.

5. The thermal analyzer for an object to be heated in a heating furnace according to claim 4, wherein the object data input means includes shape and physical property value input means for inputting a shape of a printed-wiring board and a physical property value thereof, a shape of a component mounted on the printed-wiring board and a physical property value thereof, a shape of a gap space between the component and the printed-wiring board, and a shape of a terminal space having a terminal for connecting the component and the printed-wiring board and a physical property value of the terminal, and the computation grid generating means further includes component and gap space model setting means for setting a model in which the component and gap space input from the shape and physical property value input means is regarded as a rectangular prism having a thickness that is almost equal to a thickness of the printed-wiring board, terminal model setting means for setting a model in which the input terminal space is regarded as a rectangular prism having a thickness corresponding to a size of the terminal, and correcting means for correcting physical property values for the rectangular prism models of the component, the gap space and the terminal space which are thus obtained.

6. A computer readable recording medium which records a thermal analysis program of an object to be heated in a heating furnace, causing a computer to execute the steps of:

inputting a shape and a physical property value of the object moving in the heating furnace at a predetermined speed;

dividing the object in a grid shape to generate a computation grid and for defining a physical property value for each computation element divided by the computation grid;

inputting heating conditions in the heating furnace;

setting, on the input heating conditions, a radiation boundary condition and a convection boundary condition of the object which are changed with a passage of time;

calculating a temperature distribution for each computation element every movement of the object within a predetermined range based on the set radiation boundary condition and convection boundary condition and heat conduction in the object for each generated computation element; and outputting the calculated temperature distribution.

7. The computer readable recording medium which records a thermal analysis program of an object to be heated in a heating furnace according to claim 6, wherein the step of inputting a shape of the object and a physical property value thereof includes a step of inputting a shape of a printed-wiring board and a physical property value thereof, a shape of a component mounted on the printed-wiring board and a physical property value thereof, a shape of a gap space between the component and the printed-wiring board, and a shape of a terminal space having a terminal for connecting the component and the printed-wiring board and a physical property value of the terminal, and the step of generating a computation grid to define a physical property value for each computation element includes steps of setting a model in which the input component and gap space is regarded as a rectangular prism having a thickness that is almost equal to a thickness of the printed-wiring board, setting a model in which the input terminal space is regarded as a rectangular prism having a thickness corresponding to a size of the terminal, and correcting physical property values for the rectangular prism models of the component, the gap space and the terminal space which are thus obtained.

8. A controller for a reflow furnace comprising a thermal analyzer which performs thermal analysis for a printed-wiring board moving in the reflow furnace, and a heating condition setting apparatus for setting heating conditions in the reflow furnace based on a result of the thermal analysis obtained by the thermal analyzer, the thermal analyzer including:

shape and physical property value input means for inputting a shape of a printed-wiring board to be heated in the reflow furnace and a physical property value thereof, a shape of a component mounted on the printed-wiring board and a physical property value thereof, a shape of a gap space between the component and the printed-wiring board, and a shape of a terminal space having a terminal for connecting the component and the printed-wiring board and a physical property value of the terminal;

component and gap space model setting means for setting a model in which the input component and gap space is regarded as a rectangular prism having a thickness that is almost equal to a thickness of the printed-wiring board;

terminal model setting means for setting a model in which the input terminal space is regarded as a rectangular prism having a thickness corresponding to a size of the terminal;

correcting means for correcting physical property values for the rectangular prism models of the component, the gap space and the terminal space which are thus obtained;

computation grid generating means for dividing the rectangular prism model in a grid shape to generate a computation grid and for defining a physical property value for each computation element divided by the computation grid;

heating condition input means for inputting heating conditions in the heating furnace;

setting means for setting, on the input heating conditions, a radiation boundary condition and a convection boundary condition of the object which are changed with a passage of time;

calculating means for calculating a temperature distribution for each computation element every movement of the object within a predetermined range based on the radiation boundary condition and the convection boundary condition which are set by the setting means and heat conduction in the object for each computation element generated by the computation grid generating means; and output means for outputting the temperature distribution calculated by the calculating means, and the heating condition setting apparatus including:

heating condition setting means for setting heating conditions to a plurality of heating sources respectively when heating the object by means of the heating sources in the heating furnace;

temperature detecting means for receiving, from the thermal analyzer, a temperature distribution for each computation element of the heated rectangular prism model;

computing means for computing, for each heating source, a relationship between a variation in the heating conditions in one of the heating sources and a variation in a temperature of each computation element of the rectangular prism model;

heating condition calculating means for calculating heating conditions in the heating source for causing the computation element of the rectangular prism model to have a target temperature based on the computed relationship; and control means for controlling the heating sources on the calculated heating conditions.

9. A computer readable recording medium which records a control program of a reflow furnace to cause a computer to execute steps of:

performing thermal analysis for a printed-wiring board moving in the reflow furnace; and setting heating conditions of the reflow furnace based on a result of the thermal analysis obtained at the thermal analyzing step, the thermal analyzing step including steps of:

inputting a shape of the printed-wiring board to be heated in the reflow furnace and a physical property value thereof, a shape of a component mounted on the printed-wiring board and a physical property value thereof, a shape of a gap space between the component and the printed-wiring board, and a shape of a terminal space having a terminal for connecting the component and the printed-wiring board and a physical property value of the terminal;

setting a model in which the input component and gap space is regarded as a rectangular prism having a thickness that is almost equal to a thickness of the printed-wiring board;

setting a model in which the input terminal space is regarded as a rectangular prism having a thickness corresponding to a size of the terminal;

correcting physical property values for the rectangular prism models of the component, the gap space and the terminal space which are thus obtained;

dividing the rectangular prism model in a grid shape to generate a computation grid and defining a physical property value for each computation element divided by the computation grid;

inputting heating conditions in the heating furnace;

setting, on the input heating conditions, a radiation boundary condition and a convection boundary condition of the object which are changed with a passage of time;

calculating a temperature distribution for each computation element every movement of the object within a predetermined range based on the set radiation boundary condition and convection boundary condition and heat conduction in the object for each generated computation element; and outputting the calculated temperature distribution, and the heating condition setting step including steps of:

setting heating conditions to a plurality of heating sources respectively when heating the object by means of the heating sources in the heating furnace;

receiving, from the thermal analyzer, a temperature distribution for each computation element of the heated rectangular prism model;

computing, for each heating source, a relationship between a variation in the heating conditions in one of the heating sources and a variation in a temperature of each computation element of the rectangular prism model;

calculating heating conditions in the heating source for causing the computation element of the rectangular prism model to have a target temperature based on the computed relationship; and controlling the heating sources on the calculated heating conditions.

* * * * *